United States Patent
Xie

(12) 
(10) Patent No.: US 11,416,088 B1
(45) Date of Patent: Aug. 16, 2022

(54) DRIVING CIRCUIT, STYLUS AND ELECTRONIC DEVICE

(71) Applicant: SHENZHEN GOODIX TECHNOLOGY CO., LTD., Shenzhen (CN)

(72) Inventor: Hao Xie, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/494,474

(22) Filed: Oct. 5, 2021

Related U.S. Application Data

(63) Continuation of application No. PCT/CN2021/087027, filed on Apr. 13, 2021.

(51) Int. Cl.
 G06F 3/038 (2013.01)
 G06F 3/044 (2006.01)
 H03K 17/687 (2006.01)
 H02J 7/34 (2006.01)

(52) U.S. Cl.
 CPC ............ G06F 3/0383 (2013.01); G06F 3/044 (2013.01); H02J 7/345 (2013.01); H03K 17/6871 (2013.01)

(58) Field of Classification Search
 CPC ............ G06F 3/0383; G06F 3/03545; G06F 3/044–0442; H02J 7/345; H03K 17/6871
 See application file for complete search history.

(56) References Cited

U.S. PATENT DOCUMENTS

| | | | |
|---|---|---|---|
| 9,891,724 B2* | 2/2018 | Kao | G06F 3/04182 |
| 10,788,903 B2* | 9/2020 | Yuan | G06F 3/03545 |
| 2003/0085886 A1 | 5/2003 | Ide | |
| 2017/0322644 A1 | 11/2017 | Sahar | |
| 2019/0179435 A1* | 6/2019 | Yuan | G06F 3/0412 |
| 2020/0089386 A1* | 3/2020 | Feng | G06F 3/0412 |
| 2020/0159352 A1 | 5/2020 | Shimada | |
| 2021/0041984 A1 | 2/2021 | Yuan | |

FOREIGN PATENT DOCUMENTS

| | | |
|---|---|---|
| CN | 1630893 A | 6/2005 |
| CN | 108124499 A | 6/2018 |
| CN | 110321017 A | 10/2019 |
| CN | 112640288 A | 4/2021 |

* cited by examiner

Primary Examiner — Michael Pervan

(57) ABSTRACT

Disclosed are a driving circuit, a stylus and an electronic device. The driving circuit includes: a power supply assembly, at least one energy storage capacitor, a switch assembly and a driving electrode. In a driving cycle: the switch assembly is configured to control connections among the power supply assembly, the at least one energy storage capacitor and the driving electrode, so that the driving electrode outputs a first voltage, at least one second voltage and a third voltage, wherein the first voltage and the third voltage are respectively a maximum voltage and a minimum voltage output by the driving electrode, and the sum of energy storage voltages of the at least one energy storage capacitor is less than the first voltage. The driving circuit, the stylus and the electronic device of the embodiment of the present application could reduce a power consumption.

20 Claims, 8 Drawing Sheets

DRIVING CIRCUIT, STYLUS AND ELECTRONIC DEVICE

CROSS REFERENCE TO RELATED APPLICATIONS

This application is a continuation of International Application No. PCT/CN2021/087027, filed on Apr. 13, 2021, the disclosure of which is hereby incorporated by reference in its entirety.

TECHNICAL FIELD

An embodiment of the present application relates to the field of a touch technology, and more particularly, relates to a driving circuit, a stylus and an electronic device.

BACKGROUND

Styluses in the market generally adopt a high-voltage square wave driving scheme. Since the voltage at the edge position of the square wave changes quickly and the driving frequency is high, for example, the driving frequency is generally 50 Khz-500 Khz, so that the power consumption at the equivalent capacitance of the tip electrode will be high during high-voltage driving.

SUMMARY

An embodiment of the present application provides a driving circuit, a stylus and an electronic device, so that the power consumption of a tip electrode of the stylus can be reduced.

According to a first aspect, a driving circuit is provided. The driving circuit is applied to a stylus. The driving circuit includes: a power supply assembly, at least one energy storage capacitor, a switch assembly and a driving electrode, wherein the switch assembly is configured to control a voltage of the at least one energy storage capacitor to be connected to the power supply assembly, so that the at least one energy storage capacitor reaches an energy storage voltage. In a driving cycle: the switch assembly is configured to control connections among the power supply assembly, the at least one energy storage capacitor and the driving electrode, so that the driving electrode outputs a first voltage, at least one second voltage and a third voltage, wherein the first voltage and the third voltage are respectively a maximum voltage and a minimum voltage output by the driving electrode, a difference between the first voltage and the third voltage is a driving voltage of the stylus, the at least one second voltage includes a sum of energy storage voltages of i energy storage capacitors, i is a positive integer less than or equal to n and i is evaluated in an incrementing or decrementing order, n is a number of the at least one energy storage capacitors, and a sum of energy storage voltages of the at least one energy storage capacitor is less than the first voltage.

In the technical solution of the embodiment of the present application, at least one energy storage capacitor is arranged in a driving circuit, and a switch assembly controls connection of the at least one energy storage capacitor and a driving electrode, so that the driving electrode may output a plurality of unequal voltages, that is, an existing pulse width modulation (PWM) square wave is converted into a stepped waveform to slow down a voltage change and reduce an instantaneous charging current of a tip capacitor, so that the power consumption of the driving electrode is reduced; moreover, the at least one energy storage capacitor arranged in the driving circuit may also recover charges of the tip capacitor to further reduce the driving power consumption.

In a possible implementation manner, the third voltage is equal to zero. In the driving cycle: in a first time period, the switch assembly is configured to control the power supply assembly to be connected to the driving electrode so that the driving electrode outputs the first voltage; in a second time period after the first time period, the switch assembly is configured to control the i energy storage capacitors to be connected to the driving electrode in series so that the driving electrode outputs the at least one second voltage, wherein i is evaluated in a decrementing order and the at least one second voltage is greater than zero; and in a third time period after the second time period, the switch assembly is configured to control the driving electrode to be grounded so that an output voltage of the driving electrode is zero.

In a possible implementation manner, the third voltage is equal to zero. In the driving cycle: in a fourth time period after the third time period, the switch assembly is configured to control the i energy storage capacitors to be connected to the driving electrode in series so that the driving electrode outputs the at least one second voltage, wherein i is evaluated in an incrementing order; and in a fifth time period after the fourth time period, the switch assembly is configured to control the power supply assembly to be connected to the driving electrode so that the driving electrode outputs the first voltage.

In a possible implementation manner, the third voltage is less than zero. In the driving cycle: in a first time period, the switch assembly is configured to control the power supply assembly to be connected to the driving electrode so that the driving electrode outputs the first voltage; in a second time period after the first time period, the switch assembly is configured to control the i energy storage capacitors to be connected to the driving electrode in series so that the driving electrode outputs at least one fourth voltage, wherein i is evaluated in a decrementing order, the at least one fourth voltage is greater than zero, and the at least one second voltage includes the at least one fourth voltage; in a third time period after the second time period, the switch assembly is configured to control the driving electrode to be grounded so that an output voltage of the driving electrode is zero, wherein the at least one second voltage includes a zero voltage; in a sixth time period after the third time period, the switch assembly is configured to control the i energy storage capacitors to be connected to the driving electrode in series so that the driving electrode outputs at least one fifth voltage, wherein i is evaluated in an incrementing order, the at least one fifth voltage is less than zero and the at least one second voltage includes the at least one fifth voltage; and in a seventh time period after the six time period, the switch assembly is configured to control the power supply assembly to be connected to the driving electrode so that the driving electrode outputs the third voltage, wherein an absolute value of the third voltage is greater than the sum of energy storage voltages of the at least one energy storage capacitor.

In a possible implementation manner, the third voltage is less than zero. In the driving cycle: in an eighth time period after the seventh time period, the switch assembly is configured to control the i energy storage capacitors to be connected to the driving electrode in series so that the driving electrode outputs the at least one fifth voltage, wherein i is evaluated in a decrementing order; in a ninth time period after the eighth time period, the switch assembly is configured to control the driving electrode to be grounded so that the output voltage of the driving electrode is zero; in a fourth time period after the ninth time period, the switch assembly is configured to control the i energy storage capacitors to be connected to the driving electrode in series so that the driving electrode outputs the at least one fourth voltage, wherein i is evaluated in an incrementing order; and in a fifth time period after the fourth time period, the switch assembly is configured to control the power supply assembly to be connected to the driving electrode so that the driving electrode outputs the first voltage.

In a possible implementation manner, an absolute value of the third voltage is equal to an absolute value of the first voltage.

In a possible implementation manner, the switch assembly includes a first switch, wherein one end of the first switch is connected to a first output end included in the power supply assembly and the other end of the first switch is connected to the driving electrode, the first switch is switched on in the first time period and the fifth time period in the driving cycle and is switched off in time periods except the first time period and the fifth time period in the driving cycle, and the first output end is configured to output the first voltage.

In a possible implementation manner, the switch assembly includes a second switch, wherein one end of the second switch is grounded and the other end of the second switch is connected to the driving electrode, and the second switch is switched on in the third time period and the ninth time period in the driving cycle and is switched off in time periods except the third time period and the ninth time period in the driving cycle.

In a possible implementation manner, the switch assembly includes a third switch, wherein one end of the third switch is connected to a second output end included in the power supply assembly and the other end of the third switch is connected to the driving electrode, the third switch is switched on in the seventh time period in the driving cycle and is switched off in time periods except the seventh time period in the driving cycle, and the second output end is configured to output the third voltage.

In a possible implementation manner, the switch assembly includes n fourth switches and a fifth switch, wherein the n fourth switches are in one-to-one correspondence with n energy storage capacitors, one end of each of the n fourth switches is connected to the driving electrode and the other end of each of the n fourth switches is connected to a first end of a corresponding energy storage capacitor, one end of the fifth switch is grounded and the other end of the fifth switch is connected to a second end of the at least one energy storage capacitor, the n fourth switches are switched on in the second time period and the fourth time period in the driving cycle sequentially to control the i energy storage capacitors to be connected to the driving electrode, the n fourth switches are switched off in time periods except the second time period and the fourth time period in the driving cycle, and the fifth switch is configured to be switched on in the second time period and the fourth time period in the driving cycle and to be switched off in time periods except the second time period and the fourth time period in the driving cycle.

In a possible implementation manner, the switch assembly includes a sixth switch and n seventh switches, wherein one end of the sixth switch is grounded and the other end of the sixth switch is connected to a first end of the at least one energy storage capacitor, the n seventh switches are in one-to-one correspondence with the n energy storage capacitors, one end of each of the n seventh switches is connected to the driving electrode and the other end of each of the n seventh switches is connected to a second end of the corresponding energy storage capacitor, the sixth switch is configured to be switched on in the sixth time period and the eighth time period in the driving cycle and to be switched off in time periods except the sixth time period and the eighth time period in the driving cycle, the n seventh switches is switched on in the sixth time period and the eighth time period in the driving cycle sequentially to control the i energy storage capacitors to be connected to the driving electrode, and the n seventh switches are switched off in time periods except the sixth time period and the eighth time period in the driving cycle.

In a possible implementation manner, the switch assembly further includes an eighth switch, wherein one end of the eighth switch is connected to a third output end included in the power supply assembly and the other end of the eighth switch is connected to a first end of the at least one energy storage capacitor, the eighth switch is switched on in the first time period and the fifth time period in the driving cycle and is switched off in time periods except the first time period and the fifth time period in the driving cycle, and the third output end is configured to provide an energy storage voltage for the at least one energy storage capacitor.

In a possible implementation manner, the at least one energy storage capacitor is a plurality of energy storage capacitors, wherein capacitances of the plurality of energy storage capacitors are equal.

In a possible implementation manner, a capacitance of each of the at least one energy storage capacitor is 20 to 100 times a preset capacitance, wherein the preset capacitance is a capacitance of an equivalent capacitor between the driving electrode and a touch screen.

In a possible implementation manner, the power supply assembly includes a first capacitor, a second capacitor, a ninth switch and a tenth switch, wherein one end of the first capacitor is connected to a first output end of the power supply assembly and the other end of the first capacitor is connected to one end of the ninth switch and one end of the tenth switch, the other end of the ninth switch is grounded, the other end of the tenth switch is connected to one end of the second capacitor, and the one end of the second capacitor is a second output end of the power supply assembly and the other end of the second capacitor is grounded; in the first time period and the fifth time period of the driving cycle, the first output end is configured to output the first voltage, the ninth switch is switched on and the tenth switch is switched off, and in the seventh time period of the driving cycle, an output voltage of the first output end is zero, the ninth switch is switched off and the tenth switch is switched on, so that the second output end outputs the third voltage and the third voltage is less than zero.

According to a second aspect, a driving circuit is provided. The driving circuit is applied to a stylus. The driving circuit includes a switch assembly and a driving electrode, wherein the driving electrode includes a tip of the stylus. In a driving cycle: in a first time, the switch assembly is configured to control the driving electrode to output a first voltage; in a second time after the first time, the switch assembly is configured to control the driving electrode to output at least one second voltage, wherein the at least one second voltage is less than the first voltage; in a third time after the second time, the switch assembly is configured to control the driving electrode to output a third voltage, wherein the third voltage is less than the at least one second voltage, and a difference between the first voltage and the third voltage is a driving voltage of the stylus; in a fourth time after the third time, the switch assembly is configured to control the driving electrode to output the at least one second voltage; and in a fifth time after the fourth time, the switch assembly is configured to control the driving electrode to output the first voltage.

In a possible implementation manner, the driving circuit includes: at least one energy storage capacitor, and the at least one second voltage includes the sum of energy storage voltages of i energy storage capacitors, wherein i is a positive integer less than or equal to n and i is evaluated in an incrementing or decrementing order, n is the number of the at least one energy storage capacitors, and the sum of energy storage voltages of the at least one energy storage capacitor is less than the first voltage.

In a possible implementation manner, the third voltage is equal to zero, and the driving circuit further includes a power supply assembly and a switch assembly. In the driving cycle: in a first time period included in the first time, the switch assembly is configured to control the power supply assembly to be connected to the driving electrode so that the driving electrode outputs the first voltage; in a second time period included in the second time, the switch assembly is configured to control the i energy storage capacitors to be connected to the driving electrode in series so that the driving electrode outputs the at least one second voltage, wherein i is evaluated in a decrementing order and the at least one second voltage is greater than zero; and in a third time period included in the third time, the switch assembly is configured to control the driving electrode to be grounded so that an output voltage of the driving electrode is zero.

In a possible implementation manner, in the driving cycle: in a fourth time period included in the fourth time, the switch assembly is configured to control the i energy storage capacitors to be connected to the driving electrode in series so that the driving electrode outputs the at least one second voltage, wherein i is evaluated in an incrementing order; and in a first time period included in the fifth time, the switch assembly is configured to control the power supply assembly to be connected to the driving electrode so that the driving electrode outputs the first voltage.

In a possible implementation manner, the third voltage is less than zero, and the driving circuit further includes a power supply assembly and a switch assembly. In the driving cycle: in a first time period included in the first time, the switch assembly is configured to control the power supply assembly to be connected to the driving electrode so that the driving electrode outputs the first voltage; in a second time period included in the second time, the switch assembly is configured to control the i energy storage capacitors to be connected to the driving electrode in series so that the driving electrode outputs at least one fourth voltage, wherein i is evaluated in a decrementing order, the at least one fourth voltage is greater than zero, and the at least one second voltage includes the at least one fourth voltage; in a third time period after the second time period, the switch assembly is configured to control the driving electrode to be grounded so that an output voltage of the driving electrode is zero, wherein the at least one second voltage includes a zero voltage; in a sixth time period after the third time period, the switch assembly is configured to control the i energy storage capacitors to be connected to the driving electrode in series so that the driving electrode outputs at least one fifth voltage, wherein i is evaluated in an incrementing order, the at least one fifth voltage is less than zero, the at least one second voltage includes the at least one fifth voltage, and the second time includes the sixth time period; and in a seventh time period after the six time period, the switch assembly is configured to control the power supply assembly to be connected to the driving electrode so that the driving electrode outputs the third voltage, wherein an absolute value of the third voltage is greater than the sum of energy storage voltages of the at least one energy storage capacitor.

In a possible implementation manner, in the driving cycle: in an eighth time period in the fourth time, the switch assembly is configured to control the i energy storage capacitors to be connected to the driving electrode in series so that the driving electrode outputs the at least one fifth voltage, wherein i is evaluated in a decrementing order; in a ninth time period after the eighth time period, the switch assembly is configured to control the driving electrode to be grounded so that the output voltage of the driving electrode is zero, wherein the fourth time includes the ninth time period; in a fourth time period after the ninth time period, the switch assembly is configured to control the i energy storage capacitors to be connected to the driving electrode in series so that the driving electrode outputs the at least one fourth voltage, wherein i is evaluated in an incrementing order and the fourth time includes the fourth time period; and in a fifth time period included in the fifth time, the switch assembly is configured to control the power supply assembly to be connected to the driving electrode so that the driving electrode outputs the first voltage.

In a possible implementation manner, the absolute value of the third voltage is equal to an absolute value of the first voltage.

In a possible implementation manner, the at least one energy storage capacitor is a plurality of energy storage capacitors, wherein capacitances of the plurality of energy storage capacitors are equal.

In a possible implementation manner, a capacitance of each of the at least one energy storage capacitor is 20 to 100 times a preset capacitance, wherein the preset capacitance is a capacitance of an equivalent capacitor between the driving electrode and a touch screen.

According to a third aspect, a stylus is provided. The stylus includes: the driving circuit as defined in the first aspect, the second aspect or any one of possible implementation manners in the first aspect and the second aspect.

According to a fourth aspect, an electronic device is provided. The electronic device includes: a touch screen; and the stylus as defined in the third aspect.

DESCRIPTION OF EMBODIMENTS

The technical solutions in embodiments of the present application are described below with reference to the accompanying drawings.

Figure 1:
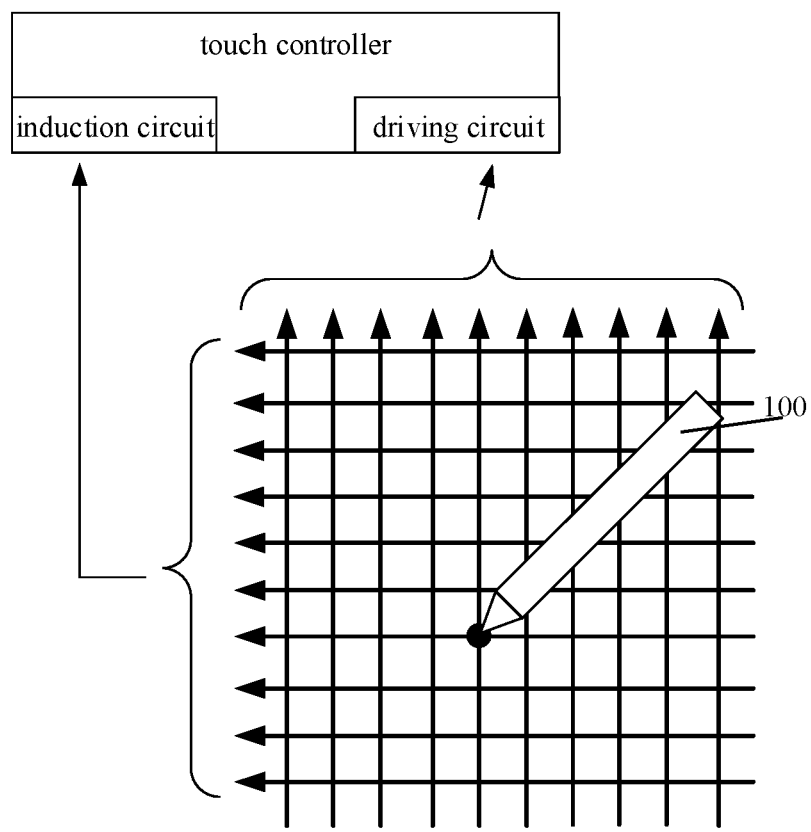
FIG. 1 is a schematic diagram of cooperative work of an electronic device and a stylus according to an embodiment of the present application.

FIG. 1 is a schematic diagram of coordinate position detection of a stylus 100. A detection system of a capacitance type stylus mainly includes the stylus 100 and a touch screen. The stylus 100 according to an embodiment of the present application may be applied to an electronic device with a touch screen. For example, the electronic device may be a notebook computer, a tablet computer or a smartphone. The electronic device with a stylus function will actively inform the stylus 100 after recognizing that the stylus 100 is approaching. The stylus 100 may make the electronic device determine coordinates of the stylus 100 through active driving so as to realize a writing function. In addition, the stylus 100 may also have a pressure detection function, and the stylus 100 may synchronously transmit pressure data to the electronic device, thereby realizing handwriting with different thicknesses.

As shown in FIG. 1, a certain amount of vertical direction and horizontal direction detection electrodes are distributed on the touch screen of the electronic device. For example, the electrodes may be a driving electrode and a sensing electrode of a mutual capacitance type touch screen, which are connected to a driving circuit and a sensing circuit respectively. The stylus 100 may transmit a driving signal to the outside through an electrode located at a tip. The driving signal may be an excitation signal. After being detected by the touch screen, the driving signal may be used to calculate coordinates of the stylus 100 on the touch screen. For example, when the driving signal output from the tip acts on a certain position of the screen, a horizontal electrode and a longitudinal electrode corresponding to the position will generate corresponding detection signals, and the touch screen may calculate two-dimensional position coordinates of the stylus 100 on the screen according to the detection signals through a touch controller. In addition, the electrode at the tip may also be connected to a pressure sensor. The pressure sensor is configured to detect a pressure generated by the stylus 100 to the touch screen, so that the stylus 100 may sense the change of a writing strength of a user and the touch screen may change the thickness of handwriting according to the change of the writing strength, thereby achieve excellent user effect experience.

Figure 2:
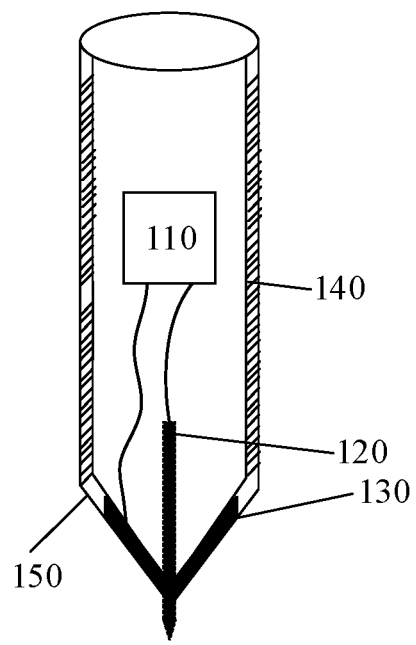
FIG. 2 is a schematic diagram of a stylus according to an embodiment of the present application.

FIG. 2 is a schematic sectional diagram of a stylus 100. As shown in FIG. 2, the stylus 100 includes a main board 110, a main electrode 120, an inclined electrode 130, a tip shell 150 and a body shell 140. Ahead of the main electrode 120 may be a tip of the stylus 100 for writing on a surface of a touch screen of an electronic device. The rest part of the main electrode 120 may be wrapped by at least one part of the tip shell 150 and the body shell 140. The tip shell 150 and the body shell 140 may be made of an insulating material, such as silica gel or plastic. The main board 110 is usually located inside the stylus 100 and is wrapped by the body shell 140. The inclined electrode 130 is usually located at the tip shell 150, for example, the inclined electrode 130 may serve as a part of the tip shell 150. The main electrode 120 and the inclined electrode 130 are combined together for detecting a pose of the stylus. For example, the main board 110 may control the main electrode 120 to transmit a driving signal to the outside so as to calculate tip position coordinates of the stylus 100 based on the principle shown in FIG. 1; and the main board 110 may also control the inclined electrode 130 to transmit a driving signal to the outside, especially when a body of the stylus 100 inclines, a driving signal transmitted by the inclined electrode 130 may be used to calculate an inclination angle of the stylus 100. A touch screen may present a handwriting form matched with the inclination degree to a user according to the inclination angle, thereby improving user experience.

Figure 3:
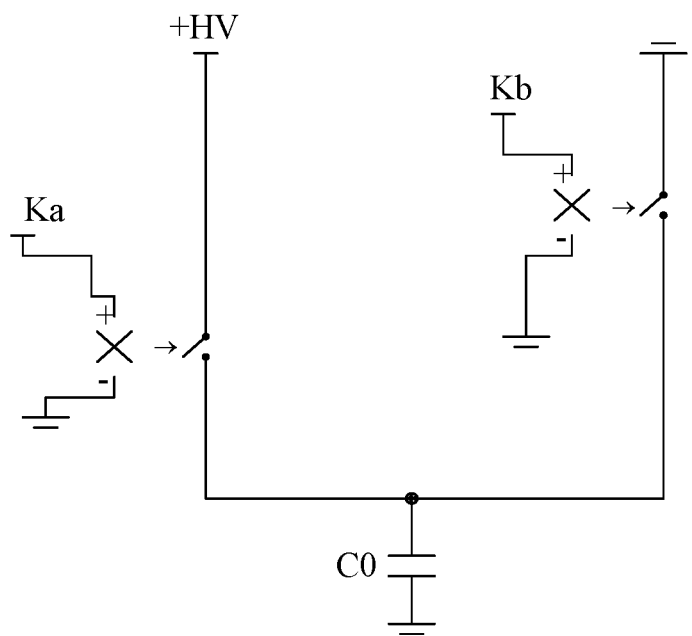
FIG. 3 is a schematic diagram of a driving circuit.

It should be understood that the stylus 100 generally adopts a high-voltage square wave driving scheme. FIG. 3 shows a schematic diagram of a circuit adopting a square wave driving scheme. As shown in FIG. 3, the circuit includes two switches Ka and Kb. Here, taking the case where the two switches Ka and Kb are pressure control switches as an example, optionally, the two switches may also be a metal-oxide-semiconductor field-effect transistor (MOSFET); and moreover, for simplifying the description, a driving circuit of the MOSFET has been omitted. In addition, a capacitor C0 in the circuit represents an equivalent capacitor between the driving electrode of the stylus 100 and the touch screen. For the convenience of description, the capacitor is called a tip capacitor C0 in the embodiment of the present application, wherein the driving electrode may be the main electrode 120 shown in FIG. 2, and a difference between a maximum peak value and a minimum peak value in voltages output by the driving electrode of the stylus 100 is a driving voltage of the stylus 100.

Figure 4:
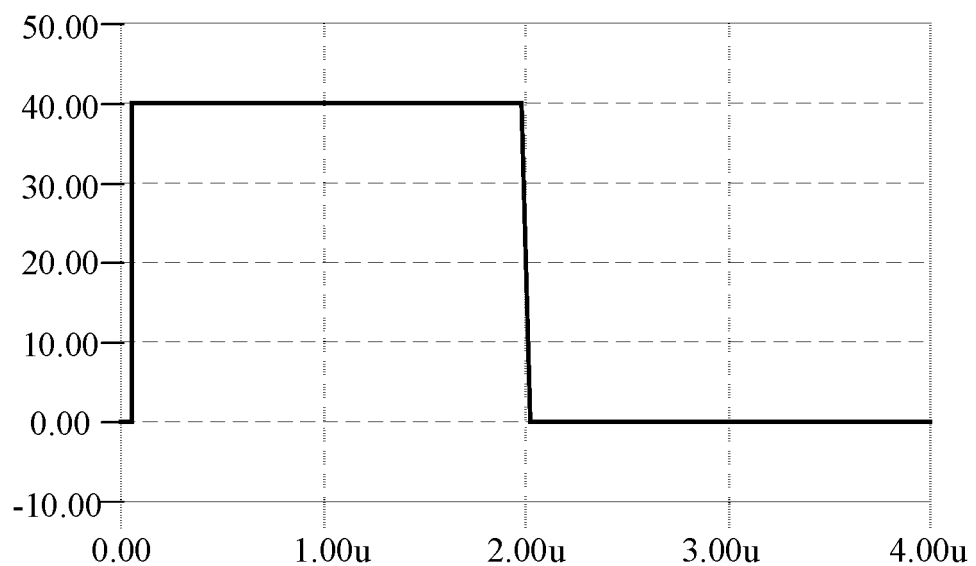
FIG. 4 is a schematic diagram of an output voltage of the driving circuit in FIG. 3.

FIG. 4 shows a schematic diagram of a driving voltage output by the stylus 100. As shown in FIG. 3 and FIG. 4, a waveform of the voltage output by the driving electrode of the stylus 100 is a traditional PWM square wave in a driving cycle by alternately switching on the two switches Ka and Kb. In FIG. 4, the case where the voltage output by the driving electrode of the stylus 100 is equal to 40V and 0V is taken as an example, that is, the driving voltage of the stylus 100 is equal to 40V−0V=40V.

At the edge position of the PWM square wave, the voltage changes rapidly between 40V and 0V, resulting in a higher instantaneous charging current of the tip capacitor C0; furthermore, since the driving frequency is high, for example, the driving frequency is generally 50 Khz-500 Khz, so the power consumption at the tip capacitor C0 is high in this high-voltage driving process; in addition, since there is no charge recovery in that stage that the voltage of the tip capacitor C0 changes from 40V to 0V, which leads to that charges stored in the tip capacitor C0 are completely wasted, so that the overall power consumption is further increased.

Therefore, an embodiment of the present application provides a driving circuit, which may solve the above problem.

Figure 5:
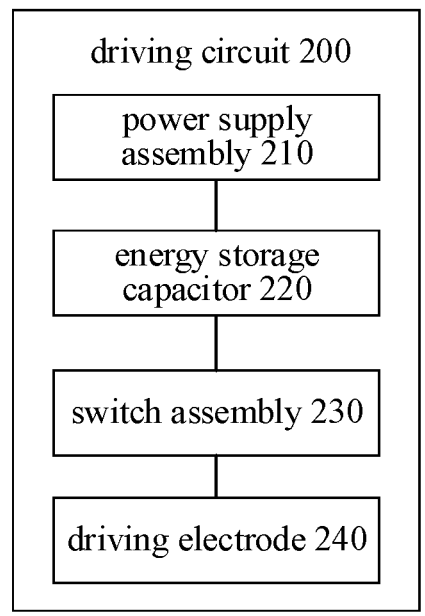
FIG. 5 is a schematic block diagram of a driving circuit according to an embodiment of the present application.

FIG. 5 shows a schematic block diagram of a driving circuit 200 according to an embodiment of the present application. The driving circuit 200 may be applied to the stylus 100. As shown in FIG. 5, the driving circuit 200 may include: a switch assembly 230 and a driving electrode 240, wherein the switch assembly 230 may be configured to control an output voltage of the driving electrode 240. Specifically, in a driving cycle, the switch assembly 230 may control the driving electrode 240 to output a first voltage, at least one second voltage and a third voltage, wherein the first voltage and the third voltage are a maximum voltage and a minimum voltage output by the driving electrode 240, and a difference between the first voltage and the third voltage is a driving voltage of the stylus 100.

Optionally, the driving cycle may include a plurality of different time periods according to different voltages output by the driving electrode 240. For example, the driving cycle may include: in a first time, the switch assembly 230 is configured to control the driving electrode 240 to output a first voltage; in a second time after the first time, the switch assembly 230 is configured to control the driving electrode 240 to output at least one second voltage, wherein the at least one second voltage is less than the first voltage; in a third time after the second time, the switch assembly 230 is configured to control the driving electrode 240 to output a third voltage, wherein the third voltage is less than the at least one second voltage; in a fourth time after the third time, the switch assembly 230 is configured to control the driving electrode to output the at least one second voltage; and in a fifth time after the fourth time, the switch assembly 230 is configured to control the driving electrode to output the first voltage.

Therefore, in the driving circuit 200 according to the embodiment of the present application, the switch assembly 230 controls the driving electrode 240 to output a plurality of unequal voltages, that is, an existing PWM square wave is converted into a stepped waveform to slow down a voltage change and reduce an instantaneous charging current of a tip capacitor, so that the power consumption of the driving electrode 240 is reduced.

Optionally, as shown in FIG. 5, the driving circuit 200 may further include a power supply assembly 210 and at least one energy storage capacitor 220. Specifically, the switch assembly 230 is configured to control a voltage of the at least one energy storage capacitor 220, so that the at least one energy storage capacitor 220 reaches an energy storage voltage. In addition, a driving cycle: the switch assembly 230 is configured to control connections among the power supply assembly 210, the at least one energy storage capacitor 220 and the driving electrode 240 so that the driving electrode 240 outputs a first voltage, at least one second voltage and a third voltage, wherein the at least one second voltage includes the sum of energy storage voltages of i energy storage capacitors 220, i is a positive integer less than or equal to n and is evaluated in an incrementing order or a decrementing order, n is the number of the at least one energy storage capacitor 220, and the sum of energy storage voltages of the at least one energy storage capacitor 220 is less than the first voltage.

Therefore, in the driving circuit 200 according to the embodiment of the present application, at least one energy storage capacitor 220 is arranged, and a switch assembly 230 controls connection of the at least one energy storage capacitor 220 and a driving electrode 240, so that the driving electrode 240 may output a plurality of unequal voltages, that is, an existing PWM square wave is converted into a stepped waveform to slow down a voltage change and reduce an instantaneous charging current of a tip capacitor, so that the power consumption of the driving electrode 240 is reduced; moreover, the at least one energy storage capacitor 220 arranged in the driving circuit 200 may also recover charges of the tip capacitor to further reduce the driving power consumption.

It should be understood that the driving circuit 200 according to the embodiment of the present application may be applied to an stylus 100, wherein a driving electrode 240 of the driving circuit 200 may be a tip of the stylus 100, for example, the driving electrode 230 may be a main electrode 120 in the stylus 100 as shown in FIG. 2, which is not elaborated here for brevity.

It should be understood that in the embodiment of the present application, the first voltage and the third voltage are a maximum voltage and a minimum voltage output by the driving electrode 240 respectively; therefore, a difference between the first voltage and the third voltage is a driving voltage of the stylus 100, that is, the difference between the first voltage and the third voltage can meet the driving requirement of the stylus 100, so that the corresponding touch screen can obtain a driving signal of the stylus 100. Therefore, the first voltage and the third voltage may be set as different values respectively according to the driving requirement of the stylus 100.

Optionally, as an embodiment, the third voltage according to the embodiment of the present application may be less than zero and the first voltage is greater than 0, and correspondingly, the at least one second voltage may include voltages greater than, less than and equal to zero. Specifically, the above driving cycle can include five times, for the convenience of description, the driving cycle may be further divided into a plurality of time periods according to different voltages output in the driving cycle. Optionally, one driving cycle may include the following several time periods: in a first time period, the switch assembly 230 is configured to control the power supply assembly 210 to be connected to the driving electrode 240 so that the driving electrode 240 outputs a first voltage, wherein a first time may include the first time period; in a second time period after the first time period, the switch assembly 230 is configured to control i energy storage capacitors 220 to be connected to the driving electrode 240 in series so that the driving electrode 240 outputs at least one fourth voltage, wherein i is evaluated in a decrementing order, the at least one fourth voltage is greater than zero and the at least one second voltage includes the at least one fourth voltage; in a third time period after the second time period, the switch assembly 230 is configured to control the driving electrode 240 to be grounded so that an output voltage of the driving electrode 240 is zero, wherein the at least one second voltage includes a zero voltage; in a sixth time period after the third time period, the switch assembly 230 is configured to control the i energy storage capacitors 220 to be connected to the driving electrode 240 in series so that the driving electrode 240 outputs at least one fifth voltage, wherein i is evaluated in an incrementing order, the at least one fifth voltage is less than zero, the at least one second voltage includes the at least one fifth voltage, and a second time may include the second time period, the third time period and the sixth time period; and in a seventh time period after the sixth time period, the switch assembly 230 is configured to control the power supply assembly 210 to be connected to the driving electrode 240 so that the driving electrode 240 outputs a third voltage, wherein an absolute value of the third voltage is greater than the sum of energy storage voltages of the at least one energy storage capacitor 220, and a third time may include the seventh time period.

It should be understood that in the second time period after the first time period in the driving cycle, the switch assembly 230 may control the i energy storage capacitors 220 to be connected in series and the i energy storage capacitors 220 to be connected to the driving electrode 240 in series so that the driving electrode 240 outputs at least one fourth voltage, wherein i is evaluated in a decrementing order, and the at least one second voltage includes the at least one fourth voltage. For example, i may be evaluated sequentially from n to 1, and the corresponding driving electrode 240 may output n fourth voltages sequentially; moreover, the n fourth voltages are sequentially reduced according to an output time order; when n energy storage capacitors 220 are provided, the voltage output by the driving electrode 240 is a maximum of the n fourth voltages; and when only one energy storage capacitor 220 is provided, the voltage output by the driving electrode 240 is a minimum of the n fourth voltages, but each fourth voltage is greater than zero.

In the sixth time period after the third time period in the driving cycle, the switch assembly 230 may control the i energy storage capacitors 220 to be connected in series and the i energy storage capacitors 220 to be connected to the driving electrode 240 in series so that the driving electrode 240 outputs at least one fifth voltage, wherein i is evaluated in an incrementing order and the at least one second voltage include the at least one fifth voltage. For example, i may be evaluated sequentially from 1 to n, and the corresponding driving electrode 240 may output n fifth voltages sequentially; moreover, each fifth voltage is less than zero, and the n fifth voltages are sequentially reduced according to an output time order, that is, absolute values of the n fifth voltages are sequentially increased according to the output time order, that is, when one energy storage capacitor 220 is provided, the voltage output by the driving electrode 240 is a maximum of the n fifth voltages; and when n energy storage capacitors 220 are provided, the voltage output by the driving electrode 240 is a minimum of the n fifth voltages.

It should be understood that the above time period is a process in which the voltage output by the driving electrode 240 in the driving cycle changes from the maximum (that is, the first voltage) to the minimum (that is, the third voltage). Optionally, the driving cycle may further include a process of changing from the minimum (that is, the third voltage) to the maximum (that is, the first voltage). Specifically, one driving cycle may further include: in an eighth time period after the above seventh time period, the switch assembly 230 is configured to control i energy storage capacitors 220 to be connected to the driving electrode 240 in series so that the driving electrode 240 outputs at least one fifth voltage, wherein i is evaluated in a decrementing order; in a ninth time period after the eighth time period, the switch assembly 230 is configured to control the driving electrode 240 to be grounded so that an output voltage of the driving electrode 240 is zero; in a fourth time period after the ninth time period, the switch assembly 230 is configured to control the i energy storage capacitors 220 to be connected to the driving electrode 240 in series so that the driving electrode 240 outputs at least one fourth voltage, wherein i is evaluated in an incrementing order, and a fourth time may include the eighth time period, the ninth time period and the fourth time period; and in a fifth time period after the fourth time period, the switch assembly 230 is configured to control the power supply assembly 210 to be connected to the driving electrode 240 so that the driving electrode 240 outputs a first voltage, wherein a fifth time may include the fifth time period.

In the eighth time period in the driving cycle, the switch assembly 230 may control the i energy storage capacitors 220 to be connected in series and the i energy storage capacitors 220 to be connected to the driving electrode 240 in series so that the driving electrode 240 outputs at least one fifth voltage, wherein i is evaluated in a decrementing order. For example, i may be evaluated sequentially from n to 1, and the corresponding driving electrode 240 may output n fifth voltages sequentially; moreover, each fifth voltage is less than zero, and the n fifth voltages are sequentially increased according to an output time order, that is, absolute values of the n fifth voltages are sequentially reduced according to the output time order, that is, when n energy storage capacitors 220 are provided, the voltage output by the driving electrode 240 is a minimum of the n fifth voltages; and when n energy storage capacitors 220 are provided, the voltage output by the driving electrode 240 is a maximum of the n fifth voltages.

It should be understood that at least one fifth voltage may be output in the sixth time period and the eighth time period, for example, n fifth voltages may be output, however, values of the n fifth voltages output in the two time periods respectively may be equal, but the output orders are different. Specifically, n fifth voltages output in the sixth time period are sequentially reduced according to an output time order, but the n fifth voltages output in the eighth time period are sequentially increased according to the output time order; however, the n fifth voltages output in the sixth time period and the n fifth voltages output in the eighth time period may be identical in value.

In the fourth time period after the ninth time period in the driving cycle, the switch assembly 230 may control the i energy storage capacitors 220 to be connected in series and the i energy storage capacitors 220 to be connected to the driving electrode 240 in series so that the driving electrode 240 outputs at least one fourth voltage, wherein i is evaluated in an incrementing order. For example, i may be evaluated sequentially from 1 to n, and the corresponding driving electrode 240 may output n fourth voltages sequentially; moreover, each fourth voltage is greater than zero, and the n fourth voltages are sequentially increased according to an output time order, that is, when one energy storage capacitor 220 is provided, the voltage output by the driving electrode 240 is a minimum of the n fourth voltages output in the fourth time period; and when n energy storage capacitors 220 are provided, the voltage output by the driving electrode 240 is a maximum of the n fourth voltages.

It should be understood that at least one fourth voltage may be output in the second time period and the fourth time period, for example, n fourth voltages may be output, however, values of the n fourth voltages output in the two time periods respectively may be equal, but the output orders are different. Specifically, the n fourth voltages output in the second time period are sequentially reduced according to the output time order, and the n fourth voltages output in the fourth time period are sequentially increased according to the output time order; however, the n fourth voltages output in the second time period and the n fourth voltages output in the fourth time period may be identical in value.

It should be understood that the driving cycle in the embodiment of the present application may include part or all of the above nine time periods; a duration of each time period in the driving cycle may be set according to actual application; in addition, when the driving cycle includes a plurality of time periods, durations of the plurality of time periods may be equal or unequal. For example, taking the case where the driving cycle includes the above nine time periods as an example, the durations of the nine time periods may be set to be identical; or durations of part of time periods of the nine time periods may be set to be equal, for example, durations of the first time period and the fifth time period may be set to be equal, and durations of the second time period, the six time period, the eight time period and the fourth time period may be set to be equal, to which the embodiment of the present application is not limited.

The embodiment in which the third voltage is less than zero will be described below in detail with reference to specific embodiments.

Figure 6:
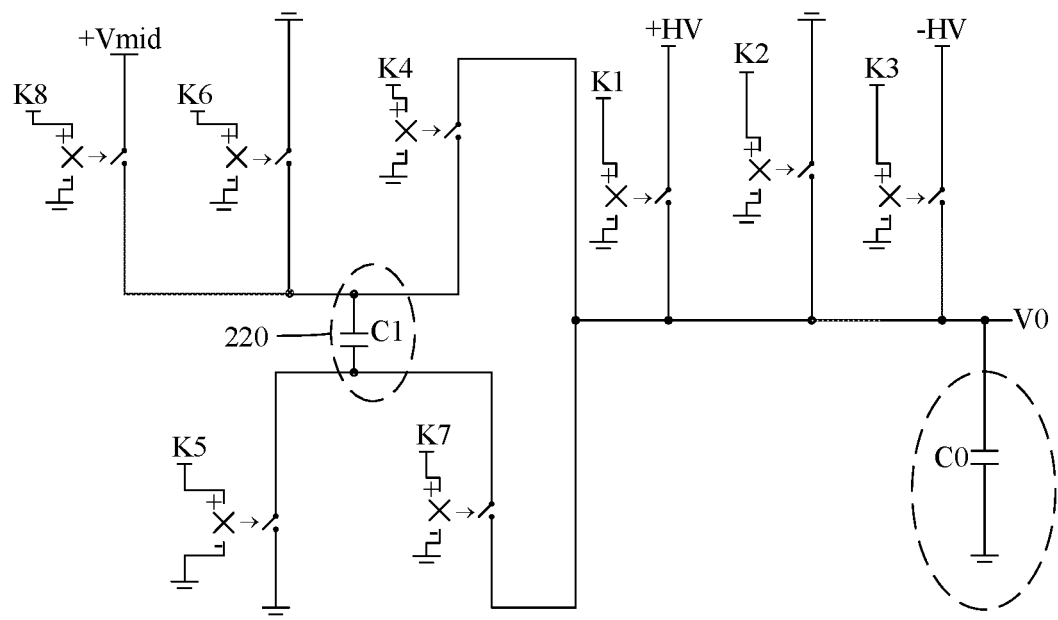
FIG. 6 is a schematic diagram of a driving circuit according to an embodiment of the present application.
Figure 7:
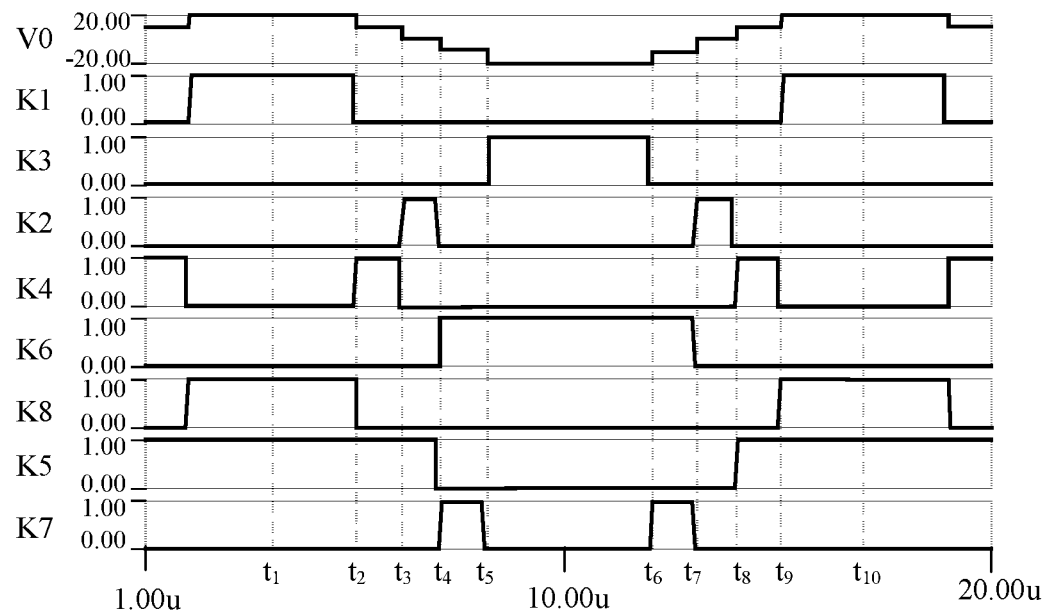
FIG. 7 is a schematic diagram of a state of each switch in the driving circuit in FIG. 6.
Figure 8:
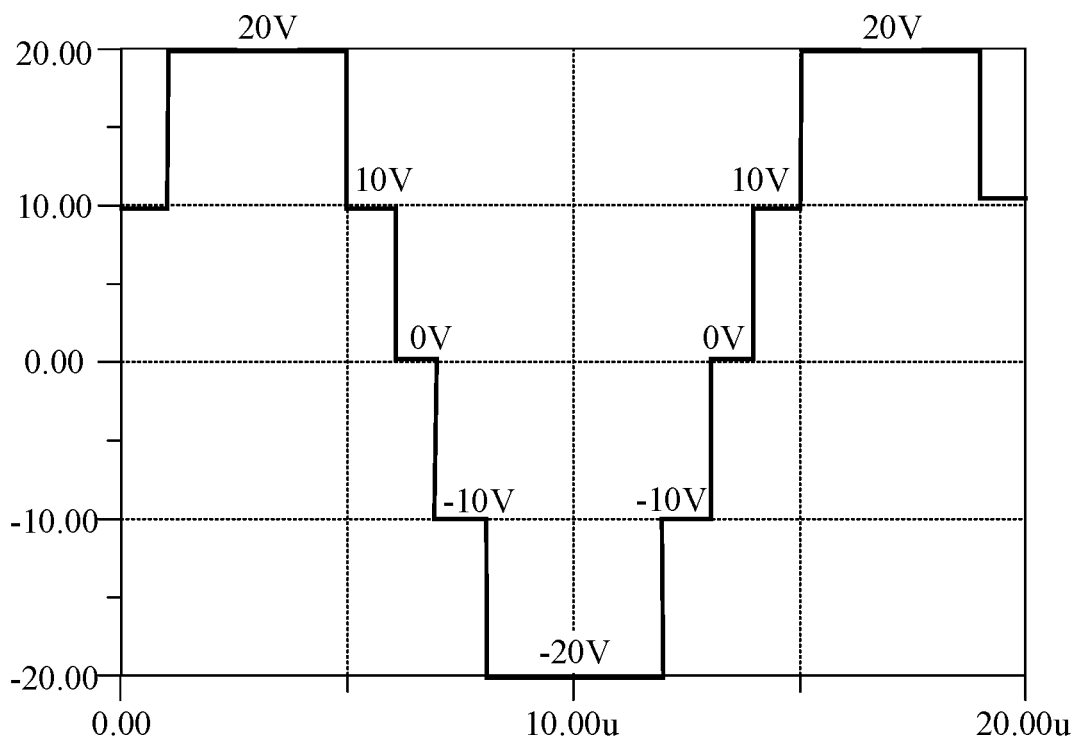
FIG. 8 is a schematic diagram of an output voltage of a driving electrode of the driving circuit in FIG. 6.

FIG. 6 shows an implementation manner of a driving circuit 200 according to an embodiment of the present application. In FIG. 6, taking the case where the driving circuit 200 only includes one energy storage capacitor 220 as an example, that is, n is equal to 1, the one energy storage capacitor 220 is represented as C1; FIG. 7 is a schematic diagram of a state of each switch included in the driving circuit 200 shown in FIG. 6, in FIG. 7, "1.00" represents that the corresponding switch is in an on state and "0.00" represents that the corresponding switch is in an off state; and FIG. 8 is a schematic diagram of a voltage output by the driving electrode 240 when the driving circuit 200 shown in FIG. 6 is adopted, wherein a horizontal axis of coordinates shown in FIG. 8 represents time and a longitudinal axis represents a voltage V0 output by the driving electrode 240, and FIG. 7 further includes a schematic diagram of the voltage V0 output by the driving electrode 240 shown in FIG. 8.

For convenience of description, one driving cycle is taken as an example. For a first time period of the driving cycle, the switch assembly 230 is configured to control the power supply assembly 210 to be connected to the driving electrode 240 so that the driving electrode 240 outputs a first voltage. Specifically, as shown in FIG. 6 to FIG. 8, the first time period may be a time $t_1$ to a time $t_2$. The switch assembly 230 may include a first switch K1, wherein one end of the first switch K1 is connected to a first output end included in the power supply assembly 210 and the other end of the first switch K1 is connected to the driving electrode 240. A tip capacitor C0 is formed between the driving electrode 240 and a touch screen. The first switch K1 is switched on in the first time period so that the tip capacitor C0 is connected to a first output end of the power supply assembly 210. A voltage output by the first output end of the power supply assembly 210 is a first voltage, wherein the first voltage is +HV, for example, taking the case where +HV is equal to +20V as an example, so a voltage of the tip capacitor C0 is a first voltage +HV, that is, a voltage output by the driving electrode 230 is a first voltage +HV, for example, as shown in FIG. 8, a voltage of the tip capacitor C0 is +20V.

Optional, in the first time period, the switch assembly 230 may further be configured to at least one energy storage voltage 220 to be connected to a power supply assembly 210, so that the at least one energy storage capacitor 220 has an energy storage voltage. Specifically, as shown in FIG. 6 and FIG. 8, the switch assembly 230 provided by the embodiment of the present application may further include a fifth switch K5 and an eighth switch K8, wherein one end of the eighth switch K8 is connected to a third output end included in the power supply assembly 210 and the other end of the eighth switch K8 is connected to a first end of the energy storage capacitor C1, and a voltage output by a third output end of the power supply assembly 210 is +Vmid; one end of the fifth switch K5 is grounded and the other end of the fifth switch K5 is connected to a second end of the energy storage capacitor C1; the fifth switch K5 and the eighth switch K8 may be switched on in the first time period of the driving cycle, so that the third output end can provide an energy storage voltage for the energy storage capacitor C1, and the energy storage voltage of the energy storage capacitor C1 is equal to an output voltage +Vmid of the third output end.

The energy storage voltage +Vmid of the energy storage capacitor C1 is greater than zero and less than a first voltage +HV. For example, the energy storage voltage +Vmid of the energy storage capacitor C1 may be equal to half of the first voltage +HV. Taking FIG. 7 to FIG. 8 as an example, when the first voltage +HV is +20V, the energy storage voltage +Vmid of the energy storage capacitor C1 may be +10V, but the embodiment of the present application is not limited to this.

For a second time period after the first time period in the driving cycle, when n is equal to 1, the switch assembly 230 is configured to control one energy storage capacitor 220 to be connected to the driving electrode 240 in series so that the driving electrode 240 outputs one fourth voltage, wherein the one fourth voltage is greater than zero and the at least one second voltage includes the one fourth voltage. Specifically, when n is equal to 1, as shown in FIG. 6 to FIG. 8, the second time period is from a time $t_2$ to a time $t_3$, and the corresponding switch assembly 230 may further include a fourth switch K4, wherein one end of the fourth switch K4 is connected to the driving electrode 240, that is, connected to a tip capacitor C0, and the other end of the fourth switch is connected to a first end of the energy storage capacitor C1. In the second time period, the first switch K1 and the eighth switch K8 are switched off, the fifth switch K5 is still switched on and the fourth switch K4 is switched on, so that the voltage of the tip capacitor C0 is reduced from the first voltage +HV in the first time period to a fourth voltage, wherein the fourth voltage is equal to an energy storage voltage +Vmid of the energy storage capacitor C1. For example, as shown in FIG. 8, the voltage of the tip capacitor C0 is reduced from +20V to +10V.

For a third time period after the second time period in the driving cycle, the switch assembly 230 is configured to control the driving electrode 240 to be grounded so that an output voltage of the driving electrode 240 is zero, wherein the at least one second voltage includes a zero voltage. Specifically, as shown in FIG. 6 to FIG. 8, the third time period may be a time $t_3$ to a time $t_4$, and the switch assembly 230 may include a second switch K2, wherein one end of the second switch K2 is grounded and the other end of the second switch K2 is connected to the driving electrode 240, that is, connected to the tip capacitor C0. The second switch K2 is switched on in the third time period, and the fourth switch K4 and the fifth switch K5 which are switched on in the second time period are switched off, so that two ends of the tip capacitor C0 are grounded, the voltage is reduced from the fourth voltage +Vmid to zero, that is, the output voltage of the driving electrode 240 is reduced to zero, for example, as shown in FIG. 8, the voltage of the tip capacitor C0 is reduced from +10V to 0V.

For a sixth time period after the third time period in the driving cycle, when n is equal to 1, the switch assembly 230 is configured to control one energy storage capacitor 220 to be connected to the driving electrode 240 in series so that the driving electrode 240 outputs one fifth voltage, wherein the one fifth voltage is less than zero, and the at least one second voltage includes the one fifth voltage. Specifically, as shown in FIG. 6 to FIG. 8, the sixth time period is from a time $t_4$ to a time $t_5$, and the switch assembly 230 may further include a sixth switch K6 and a seventh switch K7, wherein one end of the sixth switch K6 is grounded and the other end of the sixth switch K6 is connected to a first end of the energy storage capacitor C1; and one end of the seventh switch K7 is connected to the driving electrode 240, that is, connected to the, and the other end of the seventh switch K7 is connected to a second end of the energy storage capacitor C1. In the sixth time period, the switch K6 and the seventh switch K7 are switched on, and the second switch K2 which is switched on in the third time period is switched off, so that the voltage of the tip capacitor C0 is reduced from zero to the fifth voltage −Vmid, that is the voltage of the driving electrode 240 is reduced from zero to the fifth voltage −Vmid. For example, as shown in FIG. 8, the voltage of the tip capacitor C0 may be reduced from 0V to −10V.

For a seventh time period after the sixth time period in the driving cycle, the switch assembly 230 is configured to control the power supply assembly 210 to be connected to the driving electrode 240 so that the driving electrode 240 outputs a third voltage, wherein an absolute value of the third voltage is greater than the sum of energy storage voltages of the at least one energy storage capacitor 220. Specifically, as shown in FIG. 6 to FIG. 8, the seventh time period is from a time $t_5$ to a time $t_6$, the switch assembly 230 may include a third switch K3, wherein one end of the third switch K3 is connected to a second output end included in the power supply assembly 210 and the other end of the third switch K3 is connected to the driving electrode 240, that is, connected to the tip capacitor C0. In the seventh time period, the third switch K3 is switched on and the sixth switch K6 and the seventh switch K7 which are switched on in the sixth time period are switched off, so that the tip capacitor C0 is connected to a second output end of the power supply assembly 210. A voltage output by the second output end of the power supply assembly 210 is a third voltage, and the third voltage is less than zero and is less than an energy storage voltage of the energy storage capacitor C1, so that the voltage of the tip capacitor C0 is continuously reduced from −Vmid to the third voltage, that is, an output voltage of driving electrode 240 is reduced to the third voltage.

Optionally, the third voltage of the embodiment of the present application may be set according to actual application, that is, the third voltage may be set as any value less than −Vmid. For example, the embodiment of the present application is described by taking the case where the third voltage is set as −HV as an example, that is, an absolute value of the third voltage is equal to an absolute value of the third voltage. For example, as shown in FIG. 8, taking the case where the third voltage is equal to −20V, the voltage of the tip capacitor C0 is reduced from −10V to −20V.

For an eighth time period after the seventh time period in the driving cycle, when n is equal to 1, the switch assembly 230 is configured to control one energy storage capacitor 220 to be connected to the driving electrode 240 in series so that the driving electrode 240 outputs one fifth voltage, wherein the fifth voltage is equal to the fifth voltage output in the sixth time period. Specifically, as shown in FIG. 6 to FIG. 8, the eighth time period is from a time $t_6$ to a time $t_7$, the sixth switch K6 and the seventh switch K7 are switched on, and the third switch K3 which is switched on in the seventh time period is switched off, so that the voltage of the tip capacitor C0 is increased from −HV to a fifth voltage, the fifth voltage is equal to −Vmid, that is, the voltage of the driving electrode 240 is increased from −HV to the fifth voltage −Vmid. For example, as shown in FIG. 8, the voltage of the tip capacitor C0 may be increased from −20V to −10V.

In a ninth time period after the eighth time period in the driving cycle, the switch assembly 230 is configured to control the driving electrode 240 to be grounded so that an output voltage of the driving electrode 240 is zero. Specifically, as shown in FIG. 6 to FIG. 8, the ninth time period is from a time $t_7$ to a time $t_8$, the second switch K2 is switched on, and the sixth switch K6 and the seventh switch K7 which are switched on in the eighth time period are switched off, so that the voltage of the tip capacitor C0 is increased from the fifth voltage to zero, that is, the voltage of the driving electrode 240 is increased from the fifth voltage −Vmid to zero. For example, as shown in FIG. 8, the voltage of the tip capacitor C0 may be increased from −10V to 0V.

In a fourth time period after the ninth time period in the driving cycle, when n is equal to 1, the switch assembly 230 is configured to control one energy storage capacitor 220 to be connected to the driving electrode 240 in series so that the driving electrode 240 outputs one fourth voltage, wherein the fourth voltage is equal to the fourth voltage output in the second time period. Specifically, as shown in FIG. 6 to FIG. 8, the fourth time period is from a time $t_8$ to a time $t_9$, the fourth switch K4 and the fifth switch K5 are switched o, and the second switch K2 which is switched on in the ninth time period is switched off, so that the voltage of the tip capacitor C0 is increased from zero to a fourth voltage, wherein the fourth voltage is equal to +Vmid, that is, the voltage of the driving electrode 240 is increased from 0 to a fourth voltage +Vmid. For example, as shown in FIG. 8, the voltage of the tip capacitor C0 may be increased from 0V to 10V.

In a fifth time period after the fourth time period in the driving cycle, the switch assembly 230 is configured to control the power supply assembly 210 to be connected to the driving electrode 240 so that the driving electrode 240 outputs a first voltage. Specifically, as shown in FIG. 6 to FIG. 8, the fifth time period is from a time $t_9$ to a time $t_{10}$, the first switch K1 is switched on, the fourth switch K4 and the fifth switch K5 which are switched on in the fourth time period are switched off, and a first output end of the power supply assembly 210 outputs a first voltage, so that the voltage of the tip capacitor C0 is increased from a fourth voltage to a first voltage, that is, the voltage of the driving electrode 240 is increased from a fourth voltage +Vmid to a first voltage +HV. For example, as shown in FIG. 8, the voltage of the tip capacitor C0 may be increased from 10V to 20V.

Therefore, the driving electrode 240 of the driving circuit 200 shown in FIG. 6 may sequentially output the following voltages in each driving cycle according to a time sequence: +HV, +Vmid, 0, −Vmid, −HV, −Vmid, 0, +Vmid and +HV, that is, a stepped voltage can be output. Compared with the traditional square wave type voltage, the voltage changes slowly, so the instantaneous current of the tip capacitor C0 is lower and the power consumption is reduced; furthermore, the energy storage capacitor may also recycle part of charges of the tip capacitor C0, so the overall power consumption is further reduced.

Figure 9:
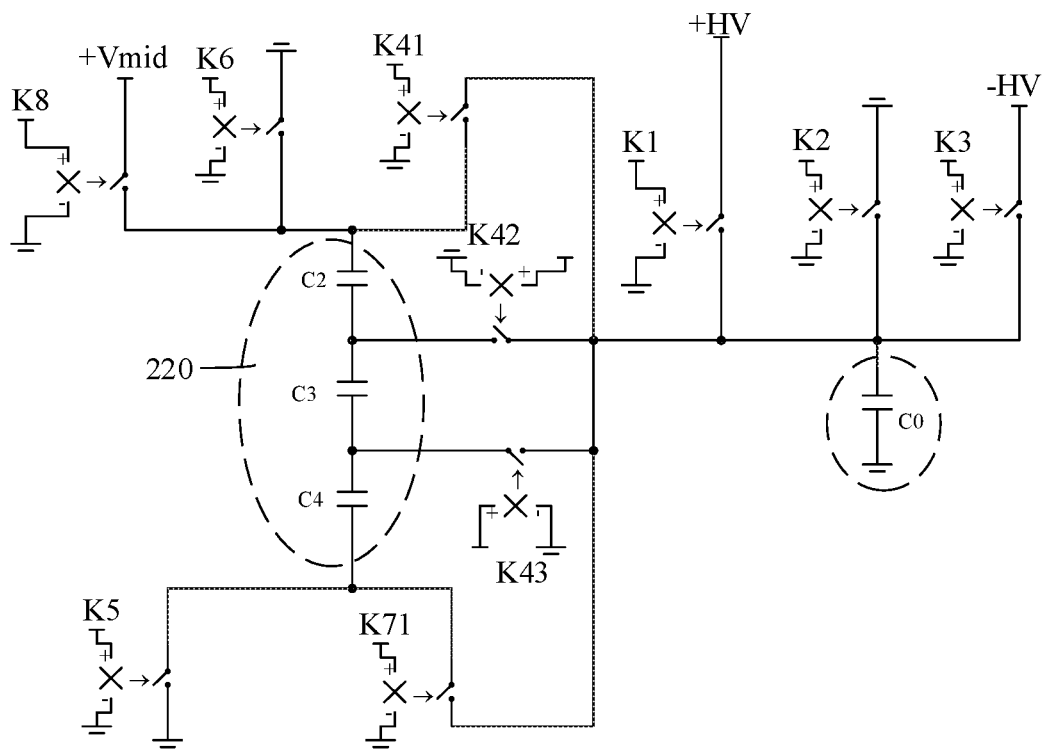
FIG. 9 is a schematic diagram of another driving circuit according to an embodiment of the present application.
Figure 10:
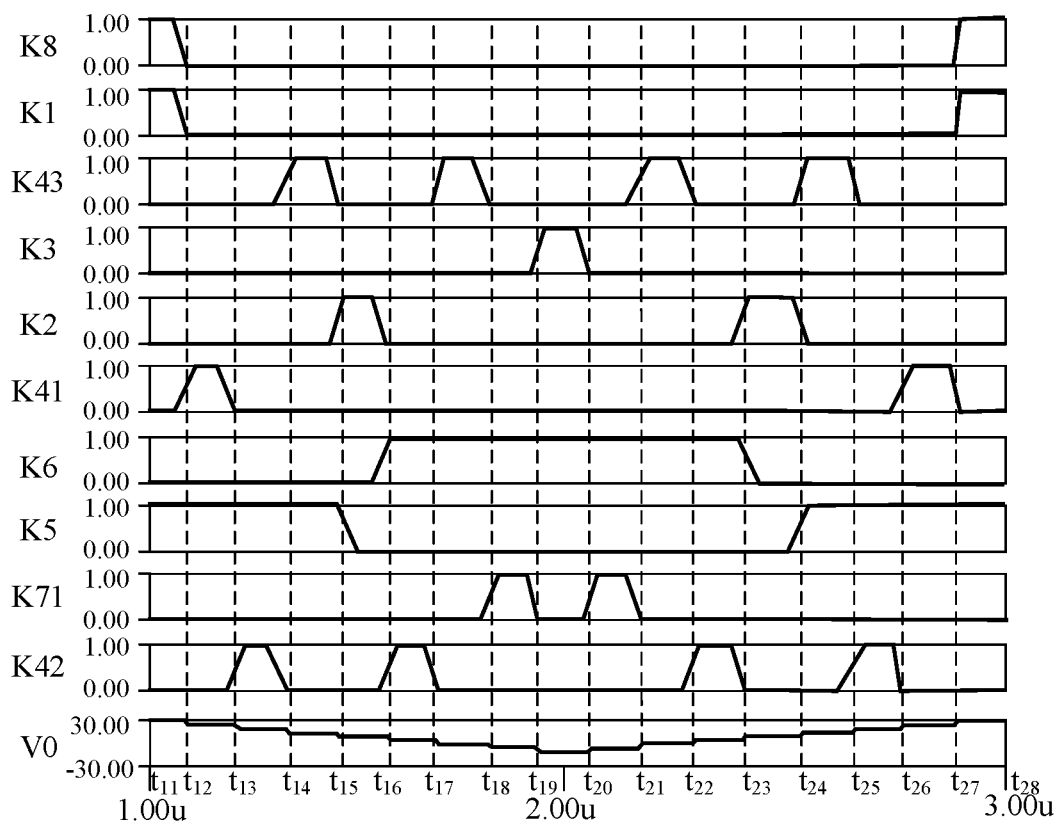
FIG. 10 is a schematic diagram of a state of each switch in the driving circuit in FIG. 9.
Figure 11:
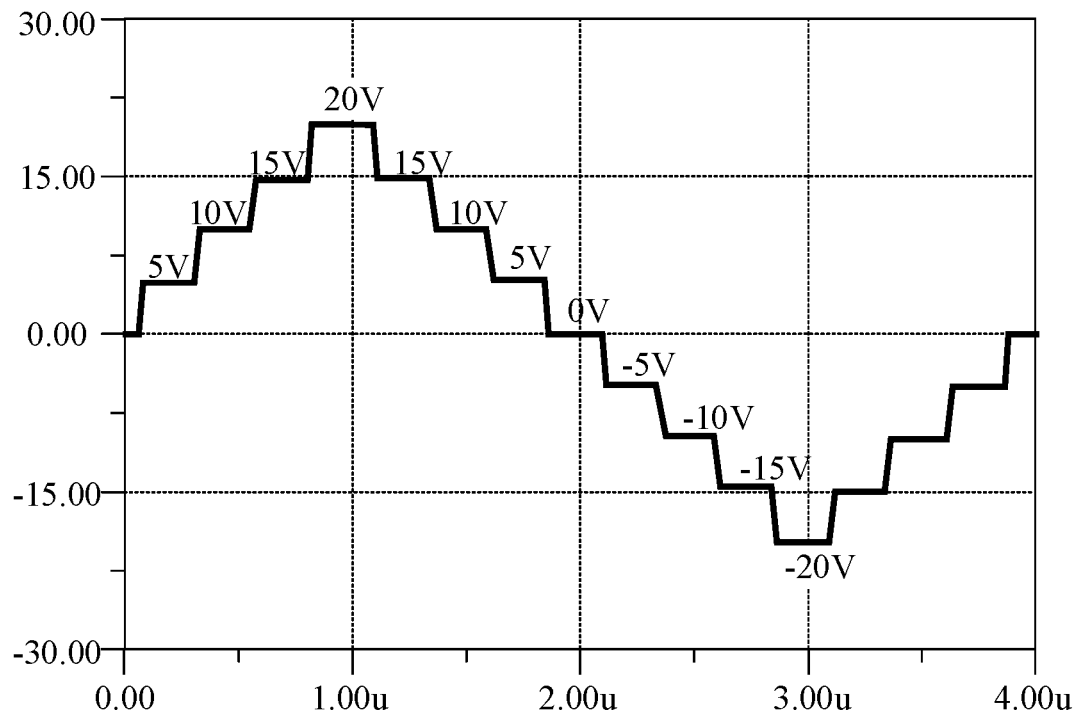
FIG. 11 is a schematic diagram of an output voltage of a driving electrode of the driving circuit in FIG. 9.

The above FIG. 6 to FIG. 8 are described by taking one energy storage capacitor 220 as an example. The driving circuit 200 is described below by a plurality of energy storage capacitors 220 with reference to the accompanying drawings. For convenience of description, the present application takes three energy storage capacitors 220 as an example. Specifically, FIG. 9 shows another implementation manner of a driving circuit 200 according to an embodiment of the present application. In FIG. 9, taking the case where the driving circuit 200 includes three energy storage capacitors 220 as an example, that is, n is equal to 3, the three energy storage capacitors 220 are represented as C2, C3 and C4 respectively; FIG. 10 is a schematic diagram of a state of each switch included in the driving circuit 200 shown in FIG. 9; in FIG. 10, "1.00" represents that the corresponding switch is in an on state and "0.00" represents that the corresponding switch is in an off state; FIG. 11 is a schematic diagram of a voltage output by the driving electrode 240 when the driving circuit 200 shown in FIG. 9 is adopted, wherein a horizontal axis of coordinates shown in FIG. 11 represents time and a longitudinal axis represents a voltage V0 output by the driving electrode 240; moreover, FIG. 10 further includes a schematic diagram of the voltage V0 output by the driving electrode 240 shown in FIG. 11.

For convenience of description, one driving cycle is still taken as an example. For a first time period of the driving cycle, the switch assembly 230 is configured to control the power supply assembly 210 to be connected to the driving electrode 240 so that the driving electrode 240 outputs a first voltage. Specifically, as shown in FIG. 9 to FIG. 11, the first time period may be a time $t_{11}$ to a time $t_{12}$. The switch assembly 230 may include a first switch K1, wherein one end of the first switch K1 is connected to a first output end included in the power supply assembly 210 and the other end of the first switch K1 is connected to the driving electrode 240. A tip capacitor C0 is formed between the driving electrode 240 and a touch screen. The first switch K1 is switched on in the first time period so that the tip capacitor C0 is connected to a first output end of the power supply assembly 210. A voltage output by the first output end of the power supply assembly 210 is a first voltage, wherein the first voltage is +HV, for example, taking the case where +HV is equal to +20V as an example, so a voltage of the tip capacitor C0 is a first voltage +HV, that is a voltage output by the driving electrode 230 is a first voltage +HV, for example, as shown in FIG. 11, a voltage of the tip capacitor C0 is +20V.

Optional, in the first time period, the switch assembly 230 may further be configured to at least one energy storage voltage 220 to be connected to a power supply assembly 210, so that the at least one energy storage capacitor 220 has an energy storage voltage. Specifically, as shown in FIG. 9 and FIG. 11, the at least one energy storage capacitor 220 is connected in series. The switch assembly 230 provided by the embodiment of the present application may further include a fifth switch K5 and an eighth switch K8, wherein one end of the eighth switch K8 is connected to a third output end included in a power supply 210 and the other end of the eighth switch K8 is connected to a first end of the at least one energy storage capacitor 220; a voltage output by the third output end of the power supply assembly 210 is +Vmid; one end of the fifth switch K5 is grounded and the other end of the fifth switch K5 is connected to a second end of the at least one energy storage capacitor 220; the fifth switch K5 and the eighth switch K8 may be switched on in the first time period of the driving cycle, so that the third output end can provide an energy storage voltage for the at least one energy storage capacitor 220 and each energy storage capacitor 220 obtains a corresponding energy storage voltage. The voltage +Vmid output by the third output end is equal to the sum of energy storage voltages of all the energy storage capacitors 220; and the energy storage voltage of each energy storage capacitor 220 is related to the output voltage +Vmid of the third output end and is also related to a capacitance of each energy storage capacitor 220. Moreover, a first voltage of the embodiment of the present application is greater than the sum of energy storage voltages of the at least one energy storage capacitor 220, that is, the first voltage is greater than the output voltage +Vmid of the third output end.

Optionally, when the driving circuit 200 is provided with a plurality of energy storage capacitors 220, a capacitance of each energy storage capacitor 220 may be the same or different. For example, capacitances of the plurality of energy storage capacitors 220 may be set to be the same so as to achieve at least one second voltage which changes relatively uniformly. Specifically, as shown in FIG. 9 to FIG. 11, the specification takes the case where the capacitances of the three energy storage capacitors C2 to C4 are the same as an example, and correspondingly, energy storage voltages of the three energy storage capacitors C2 to C4 are the same. For example, taking the case where the output voltage +Vmid of the third output end is equal to ¾ of the first voltage +HV as an example, that is, the output voltage +Vmid of the third output end is equal to 15V, the energy storage voltage of each energy storage capacitor of the three energy storage capacitors C2 to C4 is ¼ of the first voltage +HV, that is, the energy storage voltage of each energy storage capacitor is 5V, but the embodiment of the present application is not limited to this.

For a second time period after the first time period in the driving cycle, the switch assembly 230 is configured to control i energy storage capacitors 220 to be connected to the driving electrode 240 in series so that the driving electrode 240 outputs at least one fourth voltage, wherein i is evaluated in a decrementing order, that is, i is evaluated sequentially from n to 1, at least one fourth voltage is greater than zero, and the at least one second voltage includes at least one fourth voltage. Specifically, as shown in FIG. 9 to FIG. 11, the second time period is from a time $t_{12}$ to a time $t_{15}$, the corresponding switch assembly 230 may further include n fourth switches K4, the n fourth switches are in one-to-one correspondence with n energy storage capacitors 220, that is, when n is equal to 3, the three fourth switches K41, K42 and K43 correspond to the three energy storage capacitors C2, C3 and C4 respectively, wherein one end of each fourth switch is connected to the driving electrode 240, that is, connected to the tip capacitor C0, and the other end of each fourth switch is connected to a first end of the corresponding energy storage capacitor C1.

In the second time period, the first switch K1 and the eighth switch K8 are switched off, the fifth switch K5 is still switched on, and the n fourth switches are sequentially switched on, so that different voltages are output, that is, the second time period may be divided into n stages and n fourth voltages are output in total. Specifically, when n is equal to 3, at the time $t_{12}$ to a time $t_{13}$, the first fourth switch K41 is switched on, so that the voltage of the tip capacitor C0 is reduced from the first voltage +HV in the first time period to a first fourth voltage, wherein the first fourth voltage is equal to the sum +Vmid of the energy storage voltages of the three energy storage capacitors C2 to C4. For example, as shown in FIG. 11, the voltage of the tip capacitor C0 is reduced from +20V to +15V. At the time $t_{13}$ to the time $t_{14}$, a second fourth switch K42 is switched on and the first fourth switch K41 is switched off, so that the voltage of the tip capacitor C0 is reduced from +Vmid to a second fourth voltage, wherein the second fourth voltage is equal to the sum of the energy storage voltages of two energy storage capacitors C3 to C4. For example, as shown in FIG. 11, the voltage of the tip capacitor C0 is reduced from +15V to +10V. At the time $t_{14}$ to the time $t_{15}$, a third fourth switch K43 is switched on and the second fourth switch K42 is switched off, so that the voltage of the tip capacitor C0 is reduced from the second fourth voltage to a third fourth voltage, wherein the third fourth voltage is equal to an energy storage voltage of the energy storage capacitor C4 corresponding to the third fourth switch K43. For example, as shown in FIG. 11, the voltage of the tip capacitor C0 is reduced from +10V to +5V. That is, in the second time period, three fourth voltages are output in total, which are sequentially +15V, +10V and +5V according to an output time sequence.

For a third time period after the second time period in the driving cycle, the switch assembly 230 is configured to control the driving electrode 240 to be grounded, so that an output voltage of the driving electrode 240 is zero, and the at least one second voltage includes a zero voltage. Specifically, as shown in FIG. 9 to FIG. 11, the third time period may be a time $t_{15}$ to a time $t_{16}$, and the switch assembly 230 may include a second switch K2, wherein one end of the second switch K2 is grounded and the other end of the second switch K2 is connected to the driving electrode 240, that is, connected to the tip capacitor C0. The second switch K2 is switched on in the third time period, and n fourth switches K41 to K43 and the fifth switch K5 which are switched on in the second time period are switched off, so that two ends of the tip capacitor C0 are grounded, and the voltage is reduced from the finally output third fourth voltage to zero, that is, the output voltage of the driving electrode 240 is reduced to zero. For example, as shown in FIG. 11, the voltage of the tip capacitor C0 is reduced from +5V to 0V.

For a sixth time period after the third time period in the driving cycle, the switch assembly 230 is configured to control i energy storage capacitors 220 to be connected to the driving electrode 240 in series so that the driving electrode 240 outputs at least one fifth voltage, wherein i is evaluated in an incrementing order, that is, i is evaluated sequentially from 1 to n, the at least one fifth voltage is less than zero, and the at least one second voltage includes at least one fifth voltage. Specifically, as shown in FIG. 9 to FIG. 11, the sixth time period is from a time $t_{16}$ to a time $t_{19}$, and the switch assembly 230 may further include a sixth switch K6 and n seventh switches K7, wherein the n seventh switches are in one-to-one correspondence with the n energy storage capacitors 220, that is, when n is equal to 3, three seventh switches K42, K43 and K71 correspond to three energy storage capacitors C2, C3 and C4 respectively; one end of each seventh switch is connected to the driving electrode 240 and the other end of each seventh switch is connected to a second end of the corresponding energy storage capacitor 220; and one end of the sixth switch is grounded and the other end of the sixth switch is connected to first ends of the energy storage capacitors 220. It should be understood that as shown in FIG. 9, the n seventh switches and the n fourth switches provided by the embodiment of the present application may include the same switch, so that the complexity of the circuit is simplified, or the n seventh switches and the n fourth switches may also be set as completely different switches. The embodiment of the present application is not limited to this.

In the sixth time period, the sixth switch K6 is switched on, the second switch K2 which is switched on in the third time period is switched off, and the n seventh switches K7 are sequentially switched on according to a time sequence, so that the tip capacitor C0 outputs n fifth voltages, that is, the sixth time period may be divided into n stages, and n fifth voltages are output in total. Specifically, when n is equal to 3, at the time $t_{16}$ to the time $t_{17}$, the first seventh switch K42 is switched on, so that the voltage of the tip capacitor C0 is reduced from 0 in the third time period to a first fifth voltage, wherein the first fifth voltage is equal to a negative value of the energy storage voltage of the energy storage capacitor C2. For example, as shown in FIG. 11, the voltage of the tip capacitor C0 is reduced from +0V to −5V. At the time $t_{17}$ to the time tis, the second seventh switch K43 is switched on and the first seventh switch K42 is switched off, so that the voltage of the tip capacitor C0 is continuously reduced to a second fifth voltage, wherein the second fifth voltage is equal to a negative value of the sum of energy storage voltages of two energy storage capacitors C2 to C3. For example, as shown in FIG. 11, the voltage of the tip capacitor C0 is reduced from −5V to −10V. At the time tis to the time $t_{19}$, the third seventh switch K71 is switched on and the second seventh switch K43 is switched off, so that the voltage of the tip capacitor C0 is reduced from the second fifth voltage to a third fifth voltage, wherein the third fifth voltage is equal to a negative value of the sum of energy storage voltages of three energy storage capacitors C2 to C4. For example, as shown in FIG. 11, the voltage of the tip capacitor C0 is reduced from −10V to −15V. That is, in the sixth time period, three fifth voltages are output in total, which are sequentially −5V, −10V and −15V according to an output time sequence.

For a seventh time period after the sixth time period in the driving cycle, the switch assembly 230 is configured to control the power supply assembly 210 to be connected to the driving electrode 240 so that the driving electrode 240 outputs a third voltage, wherein an absolute value of the third voltage is greater than the sum of energy storage voltages of the at least one energy storage capacitor 220. Specifically, as shown in FIG. 9 to FIG. 11, the seventh time period is from a time $t_{19}$ to a time $t_{20}$, and the switch assembly 230 may include a third switch K3, wherein one end of the third switch K3 is connected to a second output end included in the power supply assembly 210 and the other end of the third switch K3 is connected to the driving electrode 240, that is, connected to the tip capacitor C0. In the seventh time period, the third switch K3 is switched on and the sixth switch K6 and n seventh switches which are switched on in the sixth time period are switched off, so that the tip capacitor C0 is connected to a second output end of the power supply assembly 210. A voltage output by the second output end of the power supply assembly 210 is a third voltage, and the third voltage is less than zero and is less than a negative value of the sum of energy storage voltages of the three energy storage capacitors C2 to C4, so that the voltage of the tip capacitor C0 is continuously reduced to the third voltage, that is, an output voltage of driving electrode 240 is reduced to the third voltage.

Optionally, the third voltage of the embodiment of the present application may be set according to actual application, that is, the third voltage may be set as any value less than −Vmid. For example, the embodiment of the present application is described by taking the case where the third voltage is set as −HV as an example, that is, an absolute value of the third voltage is equal to an absolute value of the first voltage. For example, as shown in FIG. 8, taking the case where the third voltage is equal to −20V, the voltage of the tip capacitor C0 is reduced from −15V to −20V.

For an eighth time period after the seventh time period in the driving cycle, the switch assembly 230 is configured to control i energy storage capacitors 220 to be connected to the driving electrode 240 in series so that the driving electrode 240 outputs at least one fifth voltage, wherein i is evaluated in a decrementing order, that is, i is evaluated sequentially from n to 1; and the at least one fifth voltage and the at least one fifth voltage output in the sixth time period have the same value, but have different output sequences. Specifically, as shown in FIG. 9 to FIG. 11, the eighth time period is from a time $t_{20}$ to a time $t_{23}$, the sixth switch K6 is switched on, the third switch K3 which is switched on in the seventh time period is switched off, and n seventh switches K7 are sequentially switched on, so that the voltage of the tip capacitor C0 is gradually increased from −HV and n fifth voltages are output in total, that is, the eighth time period may be divided into n stages and n fifth voltages are output in total.

Specifically, when n is equal to 3, at the time $t_{20}$ to the time $t_{21}$, the first seventh switch K71 is switched on, so that the voltage of the tip capacitor C0 is increased from a third voltage to a first fifth voltage, wherein the first fifth voltage is equal to a negative value of the sum of energy storage voltages of three energy storage capacitors C2 to C4. For example, as shown in FIG. 11, the voltage of the tip capacitor C0 is increased from −20V to −15V. At the time $t_{21}$ to the time $t_{22}$, the second seventh switch K43 is switched on and the first seventh switch K71 is switched off, so that the voltage of the tip capacitor C0 is continuously increased to a second fifth voltage, wherein the second fifth voltage is equal to a negative value of the sum of energy storage voltages of two energy storage capacitors C2 to C3. For example, as shown in FIG. 11, the voltage of the tip capacitor C0 is increased from −15V to −10V. At the time $t_{22}$ to the time $t_{23}$, the third seventh switch K42 is switched on and the second seventh switch K43 is switched off, so that the voltage of the tip capacitor C0 is increased from the second fifth voltage to the third fifth voltage, wherein the third fifth voltage is equal to a negative value of an energy storage voltage of the energy storage capacitor C2 corresponding to the third seventh switch K42. For example, as shown in FIG. 11, the voltage of the tip capacitor C0 is increased from −10V to −5V. That is, in the eighth time period, three fifth voltages are output in total, which are sequentially −15V, −10V and −5V according to an output time sequence.

For a ninth time period after the eighth time period in the driving cycle, the switch assembly 230 is configured to control the driving electrode 240 to be grounded so that an output voltage of the driving electrode 240 is zero. Specifically, as shown in FIG. 9 to FIG. 11, the ninth time period is from a time $t_{23}$ to a time $t_{24}$, the second switch K2 is switched on, and the sixth switch K6 and n seventh switches K7 which are switched on in the eighth time period are switched off, so that the voltage of the tip capacitor C0 is continuously increased to zero, that is, the voltage of the driving electrode 240 is increased from the third fifth voltage to zero. For example, as shown in FIG. 11, the voltage of the tip capacitor C0 may be increased from −5V to 0V.

For a fourth time period after the ninth time period, the switch assembly 230 is configured to control i energy storage capacitors 220 to be connected to the driving electrode 240 in series so that the driving electrode 240 outputs the at least one fourth voltage, wherein i is evaluated in an incrementing order, that is, i is sequentially evaluated from 1 to n, and the at least one fourth voltage and the at least one fourth voltage output in the second time period have the same value, but have different output sequences. Specifically, as shown in FIG. 9 to FIG. 11, the fourth time period is from a time $t_{24}$ to a time $t_{27}$, the fifth switch K4 is switched on, the second switch K2 which is switched on in the ninth time period is switched off, and n fourth switches are sequentially switched on, so that the voltage of the tip capacitor C0 is gradually increased from zero and n fourth voltages are output in total, that is, the fourth time period may be divided into n stages and n fourth voltages are output in total.

Specifically, when n is equal to 3, at the time $t_{24}$ to the time $t_{25}$, the first fourth switch K43 is switched on, so that the voltage of the tip capacitor C0 is increased from zero to the first fourth voltage, wherein the first fourth voltage is equal to an energy storage voltage of the energy storage capacitor C4. For example, as shown in FIG. 11, the voltage of the tip capacitor C0 is increased from 0V to 5V. At the time $t_{25}$ to the time $t_{26}$, the second fourth switch K42 is switched on and the first fourth switch K43 is switched off, so that the voltage of the tip capacitor C0 is continuously increased to the second fourth voltage, wherein the second fourth voltage is equal to the sum of energy storage voltages of two energy storage capacitors C3 to C4. For example, as shown FIG. 11, the voltage of the tip capacitor C0 is increased from 5V to 10V. At the time $t_{26}$ to the time $t_{27}$, the third fourth switch K41 is switched on and the second fourth switch K42 is switched off, so that the voltage of the tip capacitor C0 is increased from the second fourth voltage to the third fourth voltage, wherein the third fourth voltage is equal to the sum of energy storage voltages of three energy storage capacitors C2 to C4. For example, as shown in FIG. 11, the voltage of the tip capacitor C0 is increased from 10V to 15V. That is, in the fourth time period, three fourth voltages are output in total, which are sequentially 5V, 10V and 15V according to an output time sequence.

For a fifth time period after the fourth time period in the driving cycle, the switch assembly 230 is configured to control the power supply assembly 210 to be connected to the driving electrode 240 so that the driving electrode 240 outputs a first voltage. Specifically, as shown in FIG. 9 to FIG. 11, the fifth time period is from a time $t_{27}$ to a time $t_{28}$, the first switch K1 is switched on, n fourth switches K4 and the fifth switch K5 which are switched on in the fourth time period are switched off, and a first output end of the power supply assembly 210 outputs a first voltage, so that the voltage of the tip capacitor C0 is increased from the third fourth voltage to the first voltage, that is, the voltage of the driving electrode 240 is increased from +Vmid to the first voltage +HV. For example, as shown in FIG. 11, the voltage of the tip capacitor C0 may be increased from 15V to 20V.

It should be understood that types of various switches included in the switch assembly 230 provided by each embodiment of the present application may be selected according to actual application. For example, in FIG. 6 and FIG. 9, the case where each switch is a voltage control switch is taken as an example, or other types of switches may also be adopted, for example, an N-type or P-type MOSFET may be adopted, and the embodiment of the present application is not limited to this.

Therefore, the driving electrode 240 of the driving circuit 200 shown in FIG. 9 may sequentially output the following voltages in each driving cycle according to a time sequence: +HV, +¾HV, +½HV, +¼HV, 0, −¼HV, −½HV, −¾HV, −HV, −¾HV, −½HV, −¼HV, 0, +¼HV, +½HV, +¾HV and +HV, that is, a stepped voltage can be output. Compared with the traditional square wave type voltage or compared with the stepped voltage in FIG. 6, the voltage of the driving circuit 200 in FIG. 9 changes more slowly, so the instantaneous current of the tip capacitor C0 is lower and the power consumption is reduced; furthermore, the energy storage capacitor may also recycle part of charges of the tip capacitor C0, so the overall power consumption is further reduced.

Specifically, if the driving circuit shown in FIG. 3 is adopted, the power consumption P of the tip capacitor C0 may be represented as:

$$P = CV^2 f$$

wherein C represents a capacitance of the tip capacitor C0; V is a driving voltage, for example, as shown in FIG. 4, the driving voltage is 40V; and f is a driving frequency. If the driving circuit shown in FIG. 6 is adopted, the power consumption P of the tip capacitor C0 may be represented as:

$$P = C \times 2 \times \left(\frac{V}{2}\right)\left(\frac{V}{4}\right) f = \frac{1}{4} CV^2 f$$

wherein for the driving voltage V and the driving circuit shown in FIG. 6, V is a voltage difference between the first voltage and the third voltage, for example, as shown in FIG. 8, V is still 40V. Therefore, the power consumption of the driving circuit 200 shown in FIG. 6 is 25% of the power consumption of the driving circuit shown in FIG. 3, and the power consumption is greatly reduced. Similarly, if the driving circuit 200 shown in FIG. 9 is adopted, the power consumption of the driving circuit 200 is 12.5% of the power consumption of the driving circuit shown in FIG. 3 and the power consumption is greatly reduced, but the driving circuit 200 in FIG. 9 is more complex than that in FIG. 6.

Figure 12:
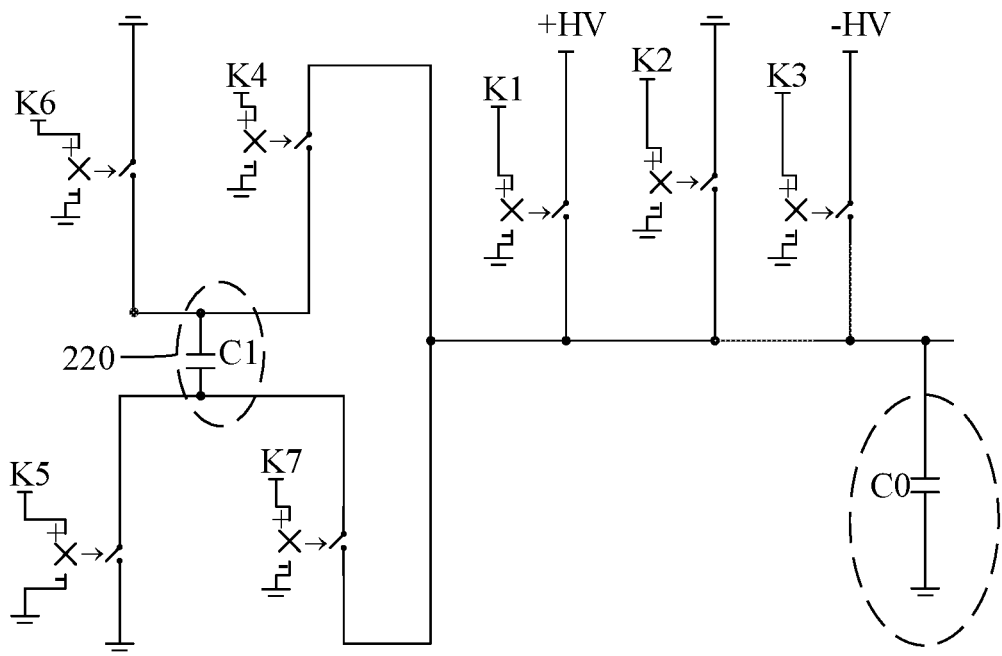
FIG. 12 is a schematic diagram of yet another driving circuit according to an embodiment of the present application.

Optionally, for the driving circuits 00 shown in FIG. 6 and FIG. 9, a third output end of the power supply assembly 210 may also be canceled, that is, the third output end providing an energy storage voltage to at least one energy storage capacitor 220 is canceled. For example, FIG. 12 shows another schematic diagram of a driving circuit 200. The difference between FIG. 12 and FIG. 6 is only that the third output end of the power supply assembly 210 is canceled. Since there is no third output end of the power supply assembly 210 to initialize the voltage of at least one energy storage capacitor 220, the energy storage voltage of the at least one energy storage capacitor 220 can only be gradually increased by recycling the charges of the tip capacitor C0 for many times. Compared with the driving circuit 200 with the third output end of the power supply assembly 210 shown in FIG. 6 or FIG. 9, the driving circuit 200 shown in FIG. 12 has the advantage that the circuit is simpler and has the disadvantage that a trapezoidal wave output by the driving circuit 200 requires a certain stabilization time, that is, after the stabilizing time, the driving circuit may enter the driving cycle in which the driving voltage can be stably output.

Figure 13:
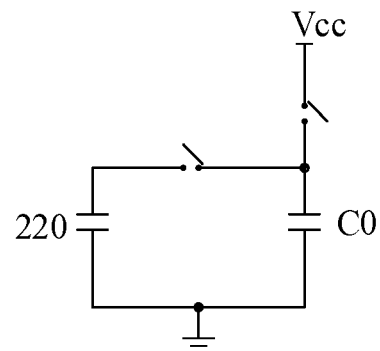
FIG. 13 is a schematic diagram that an energy storage capacitor obtains an energy storage voltage in the driving circuit in FIG. 12.

The following describes how at least one energy storage capacitor 220 obtains an energy storage voltage in the driving circuit which does not adopt the third output end of the power supply assembly 210. FIG. 13 shows a schematic diagram that the energy storage capacitor 220 in the driving circuit 200 shown in FIG. 12 obtains the energy storage voltage. As shown in FIG. 13, taking one energy storage capacitor 220 as an example, when the power supply assembly 210 charges the tip capacitor C0 for the first time, if the output voltage of the power supply assembly 210 is Vcc, the charge quantity $Q_{tip}$ of the tip capacitor C0 may be represented as: wherein $C_{tip}$ represents a capacitance of the tip capacitor C0.

When the energy storage capacitor 220 recovers energy of the tip capacitor C0, the energy storage voltage $V_{cp}$ of the energy storage capacitor 220 is:

$$V_{CP} = \frac{Q_{tip}}{C_p + C_{tip}}$$

wherein $C_p$ is a capacitance of the energy storage capacitor 220.

After energy is recovered, the charge quantity $Q_{cp}$ of the energy storage capacitor 220 may be represented as:

$$Q_{cp} = \frac{Q_{tip}}{C_p + C_{tip}} \Box C_p$$

Thereafter, when the energy storage capacitor 220 charges the tip capacitor C0 to reach balance, the voltage $Q_{cp\text{-}tip}$ is:

$$Q_{cp-tip} = \frac{Q_{cp}}{C_p + C_{tip}} = \frac{Q_{tip} \Box C_p}{C_p + C_{tip}} \Box \frac{1}{C_p + C_{tip}}$$

According to the balanced voltage, after the energy storage capacitor 220 is subjected to above first energy release, the remaining charge quantity $Q_{cp\text{-}1}$ may be represented as:

$$Q_{cp-1} = Q_{cp-tip} \Box C_p = \frac{V_{cc} \Box C_{tip} \Box C_p^2}{(C_p + C_{tip})^2}$$

By analogy, after N times of energy release, the remaining charge quantity $Q_{cp\text{-}N}$ and the voltage $V_{cp\text{-}N}$ of the energy storage capacitor 220 may be represented as:

$$Q_{cp-N} = V_{cp-tip} \Box C_p = \frac{(V_{cc} \Box C_{tip} + Q_{cp-(N-1)}) \Box C_p^2}{(C_p + C_{tip})^2}$$

$$V_{cp-N} = \frac{Q_{cp-N}}{C_p} = \frac{(V_{cc} \Box C_{tip} + Q_{cp-(N-1)}) \Box C_p}{(C_p + C_{tip})^2}$$

According to the above formula, in order to make the energy storage capacitor 220 obtain a stable energy storage voltage, for example, the stable energy storage voltage may be equal to the energy storage voltage of each energy storage capacitor 220 when there is a third output end of the power supply assembly 210 shown in FIG. 6 and FIG. 9, and the energy storage capacitor 220 can obtain the stable energy storage voltage rapidly by adjusting a size relationship between the capacitance of the energy storage capacitor 220 and the capacitance of the tip capacitor C0.

Figure 14:
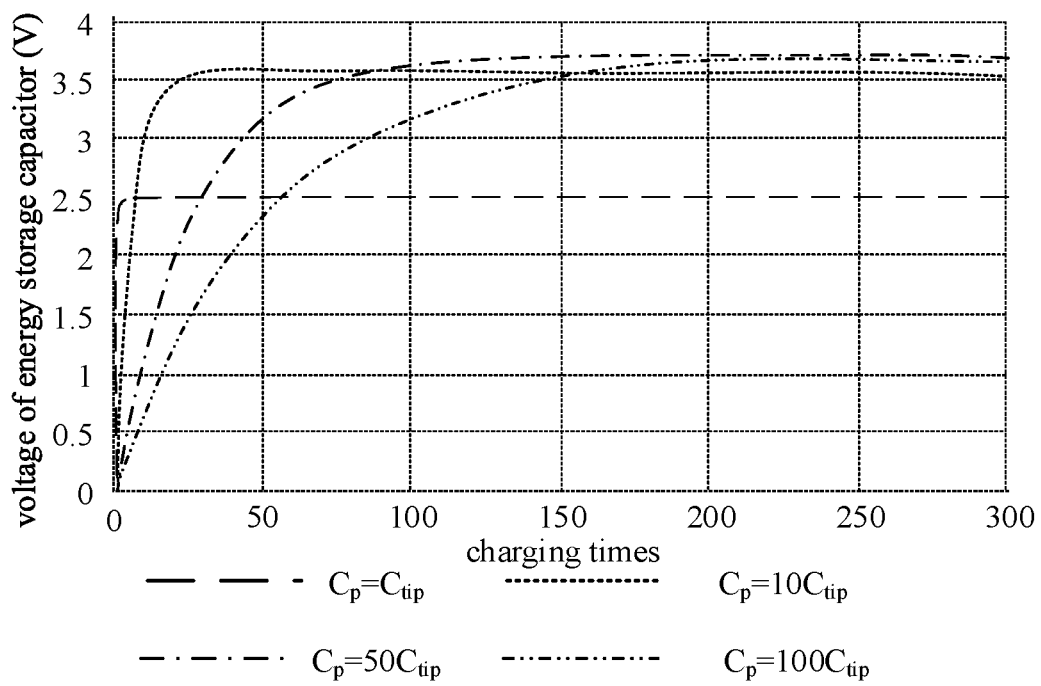
FIG. 14 is a schematic diagram of a relationship between a capacitance of an energy storage capacitor according to an embodiment of the present application and charging times required when a stable energy storage voltage is obtained.

Specifically, FIG. 14 shows the charge times required for the energy storage capacitor 220 to obtain the stable energy storage voltage when a ratio of the capacitance $C_p$ of the energy storage capacitor 220 to the capacitance $C_{tip}$ of the tip capacitor C0 is different. As shown in FIG. 14, the higher the capacitance $C_p$ of the energy storage capacitor 220 is, the more the charging times are required for the energy storage capacitor 220 to obtain the stable energy storage voltage, that is, the slower the energy storage capacitor 220 obtains a stable energy storage voltage.

Figure 15:
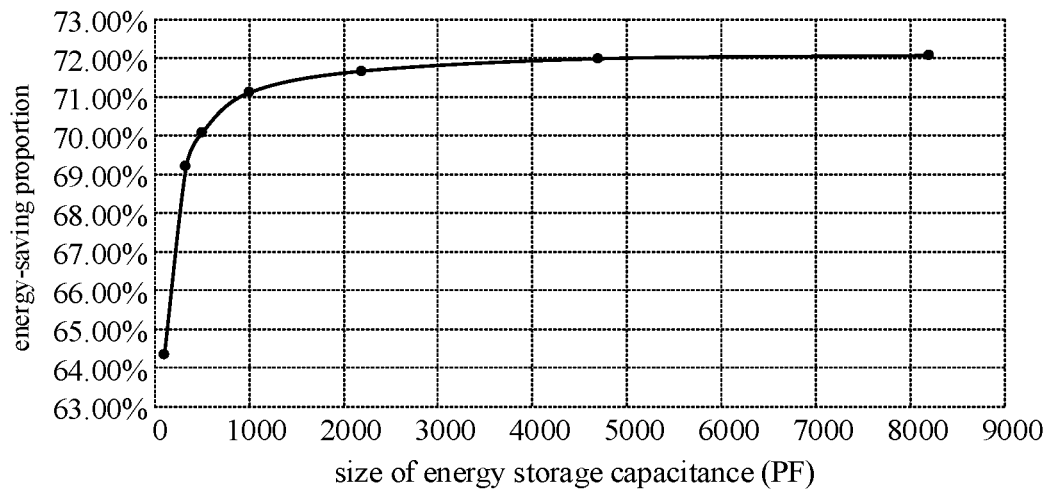
FIG. 15 is a schematic diagram of a relationship between a capacitance of an energy storage capacitor according to an embodiment of the present application and an energy-saving effect.

In addition, FIG. 15 shows a relationship curve between the capacitance of the energy storage capacitor 220 and the energy-saving effect. As shown in FIG. 15, the higher the capacitance $C_p$ of the energy storage capacitor 220 is, the more excellent the effect of reducing power consumption is, but when the capacitance $C_p$ of the energy storage capacitor 220 reaches a certain threshold, the capacitance $C_p$ of the energy storage capacitor 220 is increased again, and the effect of reducing power consumption will maintain unchanged.

Therefore, if the driving circuit 200 shown in FIG. 6 or FIG. 9 is adopted and it is unnecessary to consider the stabilization time of the energy storage capacitor 220, the capacitance $C_p$ of the energy storage capacitor 220 may be set larger, so that the effect of reducing power consumption is more excellent. However, if the power supply assembly 210 is not used to provide the energy storage capacitance for the energy storage capacitor 220, for example, the driving circuit shown in FIG. 12 is adopted, with reference to FIG. 14 and FIG. 15 and considering that the higher the capacitance $C_p$ of the energy storage capacitor 220, the more excellent the effect of reducing power consumption, but the time for obtaining the stable energy storage voltage is too long, so a compromise is required, for example, the capacitance $C_p$ of the energy storage capacitor 220 may be set to be 20 to 50 times the $C_{tip}$ of the tip capacitor, and the embodiment of the present application is not limited to this.

It should be understood that a stylus 100 provided by the embodiment of the present application may be powered by a dry battery or a lithium battery or by other means. For example, taking the case the dry battery or lithium battery is used to supply power as an example, the dry battery or lithium battery supplies power for a main board through a buck-boost direct current/direct current (DC/DC) module; moreover, the driving circuit 200 is powered by the power supply assembly 210. Specifically, the power supply assembly 210 may include a boost DC/DC module and a charge pump, so that a first voltage is output by a first output end and a third voltage is output by a second output end. Here, the case where an absolute value of the first voltage is equal to an absolute value of the third voltage is taken as an example.

Figure 16:
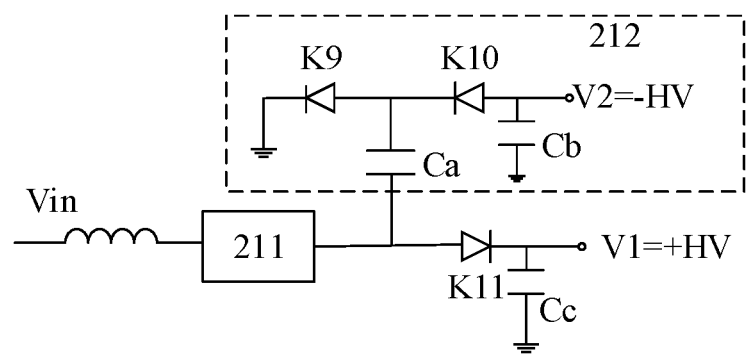
FIG. 16 is a schematic diagram of a power supply assembly according to an embodiment of the present application.

FIG. 16 shows a schematic diagram of a power supply assembly 210 according to an embodiment of the present application. As shown in FIG. 16, the power supply assembly 210 may include a boost module 211 and a charge pump 212. The charge pump 220 may specifically include: a first capacitor Ca, a second capacitor Cb, a ninth switch K9 and a tenth switch K10.

Specifically, as shown in FIG. 16, one end of the first capacitor Ca is connected to the first output end of the power supply assembly 210 and the other end of the first capacitor Ca is connected to one end of the ninth switch K9 and connected to one end of the tenth switch K10, the other end of the ninth switch K9 is grounded, the other end of the tenth switch K10 is connected to one end of the second capacitor Cb, and the one end of the second capacitor Cb is the second output end of the power supply assembly 210 and the other end of the second capacitor Cb is grounded.

Optionally, the first output end of the power supply assembly 210 may be an output end of the boost module 210, and the dry battery or lithium battery which supplies power for the stylus 100 may input a voltage Vin to the boost module 210, so that an output end of the boost module 210 may output a first voltage +HV or a zero voltage. For example, the boost module 210 may output the first voltage +HV to the charge pump 220 in the first time period and may also output the first voltage +HV to the driving circuit 200. Optionally, the power supply assembly 210 may further include an eleventh switch K11 and a third capacitor Cc, wherein one end of the eleventh switch K11 is connected to the third capacitor Cc and the other end of the eleventh switch K11 is connected to the output end of the boost module 210, and the output end of the boost module 210 outputs the first voltage +HV to the driving circuit 200 through the eleventh switch.

As shown in FIG. 16, when the output end of the boost module 210 outputs the first voltage +HV, for example, in the first time period or the fifth time period, the ninth switch K9 is switched on, the tenth switch K10 is switched off and the voltage of the first capacitor Ca is the first voltage +HV, but the voltage of the second capacitor Cb is zero, the voltage V1 output by the first output end of the power supply assembly 210 is equal to the first voltage +HV; on the contrary, when the voltage output by the output end of the boost module 210 changes from +HV to zero, for example, in the seventh time period in the driving cycle, the ninth switch K9 is switched off, the tenth switch K10 is switched on, the voltage of the first capacitor Ca is −HV and the voltage of the second capacitor Cb is also −HV, at this time, voltage V1 output by the second output end of the power supply assembly 210 is equal to a third voltage −HV.

Therefore, the power supply assembly 210 shown in FIG. 16 may be used to output the first voltage +HV and the third voltage −HV. The circuit has a simple structure and high efficiency, and conversion from +HV to −HV may be realized by connecting two switches and two capacitors, which has the advantage that the absolute value of the voltage −HV may change synchronously with +HV.

Optionally, the ninth switch K9 to the eleventh switch K11 in FIG. 16 may take diodes as an example, and may also adopt other types of switches, for example, the diodes in the figure may be replaced with the MOSFET, and the embodiment of the present application is not limited to this.

The case where the third voltage is less than zero is described above with reference to the accompanying drawings. Optionally, the third voltage in the embodiment of the present application may also be equal to zero. For the case where the third voltage is equal to zero, the second output end of the power supply assembly 210 in the driving circuit 200 shown in FIG. 6 to FIG. 11 may be canceled, and the time period when the output voltage of the driving electrode 240 in the driving cycle is less than zero is canceled, so that the output voltage of the driving electrode 240 is greater than or equal to zero and does not include a voltage less than zero.

Specifically, for the case where the third voltage is equal to zero, one driving cycle may include the follow time periods: in a first time period, the switch assembly 230 is configured to control the power supply assembly 210 to be connected to the driving electrode 240 so that the driving electrode 240 outputs a first voltage, wherein a first time may include the first time period; in a second time period after the first time period, the switch assembly 230 is configured to control i energy storage capacitors 220 to be connected to the driving electrode 240 in series so that the driving electrode 240 outputs at least one second voltage, wherein i is evaluated in a decrementing order, the at least one second voltage is greater than zero and a second time may include the second time period; and in a third time period after the second time period, the switch assembly 230 is configured to control the driving electrode 240 to be grounded so that an output voltage of the driving electrode 240 is zero, wherein a third time may include the third time period.

It should be understood that the above time period is a process in which the voltage output by the driving electrode 240 in the driving cycle changes from a maximum (that is, the first voltage) to a minimum (that is, the third voltage 0V). Optionally, the driving cycle may further include a process of changing from a minimum (that is, the third voltage 0V) to a maximum (that is, the first voltage). Specifically, one driving cycle may further include: in a fourth time period after the third time period, the switch assembly 230 is configured to control i energy storage capacitors 220 to be connected to the driving electrode 240 in series so that the driving electrode 240 outputs at least one second voltage, wherein i is evaluated in an incrementing order and a fourth time may include the fourth time period; and in a fifth time period after the fourth time period, the switch assembly 230 is configured to control the power supply assembly 210 to be connected to the driving electrode 240 so that the driving electrode 240 outputs a first voltage and a fifth time may include the fifth time period.

It should be understood that when the third voltage is equal to zero, the first time period to the fifth time period in the driving cycle correspond to the first time period to the fifth time period in the driving cycle when the third voltage is less than zero. For brevity, details are not repeated herein again.

When the third voltage is equal to zero, the driving circuit 200 may also output a stepped voltage. Taking one energy storage capacitor 220 as an example, in one driving cycle, the driving electrode 240 may sequentially output the following voltages according to a time sequence: +HV, +Vmid, 0+Vmid and +HV. Compared with the traditional square wave voltage, the stepped voltage changes slowly, the instantaneous current of the tip capacitor C0 is reduced, and the power consumption of the traditional square wave voltage may be reduced by 50%.

Therefore, in the driving circuit 200 according to the embodiment of the present application, at least one energy storage capacitor 220 is arranged, and a switch assembly 230 controls connection of the at least one energy storage capacitor 220 and a driving electrode 240, so that the driving electrode 240 may output a plurality of unequal voltages, that is, an existing PWM square wave is converted into a stepped waveform to slow down a voltage change and reduce an instantaneous charging current of a tip capacitor, so that the power consumption of the driving electrode 240 is reduced. Moreover, the at least one energy storage capacitor 220 arranged in the driving circuit 200 may also recover charges of the tip capacitor to further reduce the driving power consumption. In addition, the power supply assembly 210 provided by the embodiment of the present application may be used to provide a first voltage greater than zero and a third voltage less than zero. At this time, a topological structure of a power management unit (PMU) which the stylus 100 adopts may include the power supply assembly 210 shown in FIG. 16, and the overall efficiency of the power management unit is effectively improved while the first voltage +HV and the third voltage −V with the same absolute value are provided, so that the power consumption is further reduced.

The above is only a specific embodiment of the present application, but the protection scope of the present application is not limited to this. Various equivalent modifications or substitutions which may be easily thought by those skilled in the art in the technical scope disclosed by the present application should be covered within the protection scope of the present application. Therefore, the protection scope of the present application should be subject to the protection scope of the claims.

What is claimed is:

1. A driving circuit, the driving circuit being applied to an stylus, the driving circuit comprising: a power supply assembly, at least one energy storage capacitor, a switch assembly and a driving electrode,
   the switch assembly being configured to control a voltage of the at least one energy storage capacitor, so that the at least one energy storage capacitor reaches an energy storage voltage; and
   in a driving cycle:
   the switch assembly being configured to control connections among the power supply assembly, the at least one energy storage capacitor and the driving electrode, so that the driving electrode outputs a first voltage, at least one second voltage and a third voltage, wherein the first voltage and the third voltage are respectively a maximum voltage and a minimum voltage output by the driving electrode, a difference between the first voltage and the third voltage is a driving voltage of the stylus, the at least one second voltage comprises a sum of energy storage voltages of i energy storage capacitors, i is a positive integer less than or equal to n and i is evaluated in an incrementing or decrementing order, n is a number of the at least one energy storage capacitors, and a sum of energy storage voltages of the at least one energy storage capacitor is less than the first voltage.

2. The driving circuit according to claim 1, wherein the third voltage is equal to zero, and in the driving cycle:
   in a first time period, the switch assembly is configured to control the power supply assembly to be connected to the driving electrode so that the driving electrode outputs the first voltage,
   in a second time period after the first time period, the switch assembly is configured to control the i energy storage capacitors to be connected to the driving electrode in series so that the driving electrode outputs the at least one second voltage, i is evaluated in a decrementing order and the at least one second voltage is greater than zero, and
   in a third time period after the second time period, the switch assembly is configured to control the driving electrode to be grounded so that an output voltage of the driving electrode is zero.

3. The driving circuit according to claim 2, wherein in the driving cycle:
   in a fourth time period after the third time period, the switch assembly is configured to control the i energy storage capacitors to be connected to the driving electrode in series so that the driving electrode outputs the at least one second voltage, i is evaluated in an incrementing order; and
   in a fifth time period after the fourth time period, the switch assembly is configured to control the power supply assembly to be connected to the driving electrode so that the driving electrode outputs the first voltage.

4. The driving circuit according to claim 2, wherein the switch assembly comprises a first switch, one end of the first switch is connected to a first output end comprised in the power supply assembly, an other end of the first switch is connected to the driving electrode, the first switch is switched on in the first time period and a fifth time period in the driving cycle and is switched off in time periods except the first time period and the fifth time period in the driving cycle, and the first output end is configured to output the first voltage.

5. The driving circuit according to claim 4, wherein the power supply assembly comprises a first capacitor, a second capacitor, a ninth switch and a tenth switch, one end of the first capacitor is connected to a first output end of the power supply assembly, an other end of the first capacitor is connected to one end of the ninth switch and one end of the tenth switch, an other end of the ninth switch is grounded, an other end of the tenth switch is connected to one end of the second capacitor, the one end of the second capacitor is a second output end of the power supply assembly, an other end of the second capacitor is grounded, in the first time period and a fifth time period of the driving cycle, the first output end is configured to output the first voltage, the ninth switch is switched on and the tenth switch is switched off, and in the seventh time period of the driving cycle, an output voltage of the first output end is zero, the ninth switch is switched off and the tenth switch is switched on, so that the second output end outputs the third voltage and the third voltage is less than zero.

6. The driving circuit according to claim 2, wherein the switch assembly comprises a second switch, one end of the second switch is grounded, an other end of the second switch is connected to the driving electrode, and the second switch is switched on in the third time period and a ninth time period in the driving cycle and is switched off in time periods except the third time period and the ninth time period in the driving cycle.

7. The driving circuit according to claim 2, wherein the switch assembly comprises n fourth switches and a fifth switch, the n fourth switches are in one-to-one correspondence with n energy storage capacitors, one end of each of the n fourth switches is connected to the driving electrode, an other end of the each of the n fourth switches is connected to a first end of a corresponding energy storage capacitor, one end of the fifth switch is grounded, an other end of the fifth switch is connected to a second end of the at least one energy storage capacitor, the n fourth switches are switched on in the second time period and a fourth time period in the driving cycle sequentially to control the i energy storage capacitors to be connected to the driving electrode, the n fourth switches are switched off in time periods except the second time period and the fourth time period in the driving cycle, and the fifth switch is configured to be switched on in the second time period and the fourth time period in the driving cycle and to be switched off in time periods except the second time period and the fourth time period in the driving cycle.

8. The driving circuit according to claim 2, wherein the switch assembly further comprises an eighth switch, one end of the eighth switch is connected to a third output end comprised in the power supply assembly, an other end of the eighth switch is connected to a first end of the at least one energy storage capacitor, the eighth switch is switched on in the first time period and a fifth time period in the driving cycle and is switched off in time periods except the first time period and the fifth time period in the driving cycle, and the third output end is configured to provide an energy storage voltage for the at least one energy storage capacitor.

9. The driving circuit according to claim 1, wherein the third voltage is less than zero, and in the driving cycle:

in a first time period, the switch assembly is configured to control the power supply assembly to be connected to the driving electrode so that the driving electrode outputs the first voltage, in a second time period after the first time period, the switch assembly is configured to control the i energy storage capacitors to be connected to the driving electrode in series so that the driving electrode outputs at least one fourth voltage, i is evaluated in a decrementing order, the at least one fourth voltage is greater than zero, and the at least one second voltage comprises the at least one fourth voltage, in a third time period after the second time period, the switch assembly is configured to control the driving electrode to be grounded so that an output voltage of the driving electrode is zero, the at least one second voltage comprises a zero voltage, in a sixth time period after the third time period, the switch assembly is configured to control the i energy storage capacitors to be connected to the driving electrode in series so that the driving electrode outputs at least one fifth voltage, i is evaluated in an incrementing order, the at least one fifth voltage is less than zero, and the at least one second voltage comprises the at least one fifth voltage, and in a seventh time period after the sixth time period, the switch assembly is configured to control the power supply assembly to be connected to the driving electrode so that the driving electrode outputs the third voltage, an absolute value of the third voltage is greater than the sum of energy storage voltages of the at least one energy storage capacitor.

10. The driving circuit according to claim 9, wherein in the driving cycle:

in an eighth time period after the seventh time period, the switch assembly is configured to control the i energy storage capacitors to be connected to the driving electrode in series so that the driving electrode outputs the at least one fifth voltage, i is evaluated in a decrementing order;

in a ninth time period after the eighth time period, the switch assembly is configured to control the driving electrode to be grounded so that the output voltage of the driving electrode is zero;

in a fourth time period after the ninth time period, the switch assembly is configured to control the i energy storage capacitors to be connected to the driving electrode in series so that the driving electrode outputs the at least one fourth voltage, i is evaluated in an incrementing order; and in a fifth time period after the fourth time period, the switch assembly is configured to control the power supply assembly to be connected to the driving electrode so that the driving electrode outputs the first voltage.

11. The driving circuit according to claim 9, wherein an absolute value of the third voltage is equal to an absolute value of the first voltage.

12. The driving circuit according to claim 9, wherein the switch assembly comprises a third switch, one end of the third switch is connected to a second output end comprised in the power supply assembly, an other end of the third switch is connected to the driving electrode, the third switch is switched on in the seventh time period in the driving cycle and is switched off in time periods except the seventh time period in the driving cycle, and the second output end is configured to output the third voltage.

13. The driving circuit according to claim 9, wherein the switch assembly comprises a sixth switch and n seventh switches, one end of the sixth switch is grounded, an other end of the sixth switch is connected to a first end of the at least one energy storage capacitor, the n seventh switches is in one-to-one correspondence with n energy storage capacitors, one end of each of the n seventh switches is connected to the driving electrode, an other end of the each of the n seventh switches is connected to a second end of a corresponding energy storage capacitor, the sixth switch is configured to be switched on in a sixth time period and an eighth time period in the driving cycle and to be switched off in time periods except the sixth time period and the eighth time period in the driving cycle, the n seventh switches are switched on in the sixth time period and the eighth time period in the driving cycle sequentially to control the i energy storage capacitors to be connected to the driving electrode, and the n seventh switches are switched off in time periods except the sixth time period and the eighth time period in the driving cycle.

14. The driving circuit according to claim 1, wherein the at least one energy storage capacitor is a plurality of energy storage capacitors, and capacitances of the plurality of energy storage capacitors is equal.

15. The driving circuit according to claim 1, wherein a capacitance of each of the at least one energy storage capacitor is 20 to 100 times a preset capacitance, and the preset capacitance is a capacitance of an equivalent capacitor between the driving electrode and a touch screen.

16. A stylus, comprising:
the driving circuit as defined in claim 1.

17. A driving circuit, the driving circuit being applied to an stylus, the driving circuit comprising a switch assembly and a driving electrode, the driving electrode comprising a tip of the stylus; and in a driving cycle:
in a first time, the switch assembly being configured to control the driving electrode to output a first voltage,
in a second time after the first time, the switch assembly being configured to control the driving electrode to output at least one second voltage, the at least one second voltage being less than the first voltage,
in a third time after the second time, the switch assembly being configured to control the driving electrode to output a third voltage, the third voltage being less than the at least one second voltage, and a difference between the first voltage and the third voltage being a driving voltage of the stylus,
in a fourth time after the third time, the switch assembly being configured to control the driving electrode to output the at least one second voltage, and
in a fifth time after the fourth time, the switch assembly being configured to control the driving electrode to output the first voltage.

18. The driving circuit according to claim 17, comprising:
at least one energy storage capacitor, wherein
the at least one second voltage comprises a sum of energy storage voltages of i energy storage capacitors, i is a positive integer less than or equal to n and i is evaluated in an incrementing or decrementing order, n is a number of the at least one energy storage capacitors, and a sum of energy storage voltages of the at least one energy storage capacitor is less than the first voltage;

the driving circuit further comprises a power supply assembly and a switch assembly, wherein in the driving cycle:

in a first time period comprised in the first time, the switch assembly is configured to control the power supply assembly to be connected to the driving electrode so that the driving electrode outputs the first voltage;

in a second time period comprised in the second time, the switch assembly is configured to control the i energy storage capacitors to be connected to the driving electrode in series so that the driving electrode outputs the at least one second voltage, i is evaluated in a decrementing order and the at least one second voltage is greater than zero;

in a third time period comprised in the third time, the switch assembly is configured to control the driving electrode to be grounded so that an output voltage of the driving electrode is zero;

in a fourth time period comprised in the fourth time, the switch assembly is configured to control the i energy storage capacitors to be connected to the driving electrode in series so that the driving electrode outputs the at least one second voltage, i is evaluated in an incrementing order; and in a fifth time period comprised in the fifth time, the switch assembly is configured to control the power supply assembly to be connected to the driving electrode so that the driving electrode outputs the first voltage;

wherein the third voltage is equal to zero.

19. The driving circuit according to claim 18, wherein the third voltage is less than zero, and the driving circuit further comprises a power supply assembly and a switch assembly, wherein in the driving cycle:

in a first time period comprised in the first time, the switch assembly is configured to control the power supply assembly to be connected to the driving electrode so that the driving electrode outputs the first voltage;

in a second time period comprised in the second time, the switch assembly is configured to control the i energy storage capacitors to be connected to the driving electrode in series so that the driving electrode outputs at least one fourth voltage, i is evaluated in a decrementing order, the at least one fourth voltage is greater than zero, and the at least one second voltage comprises the at least one fourth voltage;

in a third time period after the second time period, the switch assembly is configured to control the driving electrode to be grounded so that an output voltage of the driving electrode is zero, the at least one second voltage comprises a zero voltage, and the second time comprises the third time period;

in a sixth time period after the third time period, the switch assembly is configured to control the i energy storage capacitors to be connected to the driving electrode in series so that the driving electrode outputs at least one fifth voltage, i is evaluated in an incrementing order, the at least one fifth voltage is less than zero, the at least one second voltage comprises the at least one fifth voltage, and the second time comprises the sixth time period;

in a seventh time period comprised in the third time, the switch assembly is configured to control the power supply assembly to be connected to the driving electrode so that the driving electrode outputs the third voltage, an absolute value of the third voltage is greater than the sum of energy storage voltages of the at least one energy storage capacitor;

in an eighth time period comprised in the fourth time, the switch assembly is configured to control the i energy storage capacitors to be connected to the driving electrode in series so that the driving electrode outputs the at least one fifth voltage, i is evaluated in a decrementing order; and in a ninth time period after the eighth time period, the switch assembly is configured to control the driving electrode to be grounded so that the output voltage of the driving electrode is zero, the fourth time comprising the ninth time period;

in a fourth time period after the ninth time period, the switch assembly is configured to control the i energy storage capacitors to be connected to the driving electrode in series so that the driving electrode outputs the at least one fourth voltage, i is evaluated in an incrementing order, and the fourth time comprises the fourth time period; and in a fifth time period comprised in the fifth time, the switch assembly is configured to control the power supply assembly to be connected to the driving electrode so that the driving electrode outputs the first voltage; wherein the absolute value of the third voltage is equal to an absolute value of the first voltage.

20. The driving circuit according to claim 18, wherein the at least one energy storage capacitor is a plurality of energy storage capacitors, and capacitances of the plurality of energy storage capacitors is equal; and a capacitance of each of the at least one energy storage capacitor is 20 to 100 times a preset capacitance, and the preset capacitance is a capacitance of an equivalent capacitor between the driving electrode and a touch screen.

* * * * *